United States Patent
Park et al.

(10) Patent No.: US 12,376,468 B2
(45) Date of Patent: Jul. 29, 2025

(54) DISPLAY DEVICE HAVING COMMON SUB-EMISSION LAYERS OVERLAPPING DIFFERENT PIXEL AREAS

(71) Applicant: Samsung Display Co., Ltd., Yongin-si (KR)

(72) Inventors: Jin Woo Park, Yongin-si (KR); Jungjin Yang, Seoul (KR); Soojung Youn, Seoul (KR); Seokjae Lee, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 341 days.

(21) Appl. No.: 17/463,448

(22) Filed: Aug. 31, 2021

(65) Prior Publication Data

US 2022/0190052 A1 Jun. 16, 2022

(30) Foreign Application Priority Data

Dec. 14, 2020 (KR) .......................... 10-2020-0174105

(51) Int. Cl.
*H10K 59/35* (2023.01)
*H10K 50/19* (2023.01)
*H10K 59/131* (2023.01)
*H10K 59/80* (2023.01)
*H10K 59/122* (2023.01)

(52) U.S. Cl.
CPC ............. *H10K 59/35* (2023.02); *H10K 50/19* (2023.02); *H10K 59/131* (2023.02); *H10K 59/876* (2023.02); *H10K 59/122* (2023.02)

(58) Field of Classification Search
CPC ........ H10K 59/35; H10K 50/19; H10K 59/122
USPC .......................................................... 257/40
See application file for complete search history.

(56) References Cited

U.S. PATENT DOCUMENTS

| 9,024,303 | B2 | 5/2015 | Park et al. |
| 9,515,127 | B2 | 12/2016 | Pyo et al. |
| 9,692,013 | B2 | 6/2017 | Lee et al. |
| 10,297,644 | B2 | 5/2019 | Song et al. |

(Continued)

FOREIGN PATENT DOCUMENTS

| KR | 20150043889 | 4/2015 |
| KR | 10-2016-0091517 A | 8/2016 |

(Continued)

*Primary Examiner* — Xia L Cross
(74) *Attorney, Agent, or Firm* — Womble Bond Dickinson (US) LLP

(57) ABSTRACT

A display device includes a substrate having first and second pixel areas that respectively emit first and second light, a first electrode that overlaps the first and second pixel areas, a hole transport region that overlaps the first and second pixel areas, a first organic layer disposed on the first electrode to overlap the first pixel area, a second organic layer disposed on the first electrode to overlap the second pixel area, an electron transport region disposed on the first and second organic layers to overlap the first and second pixel areas, and a second electrode disposed on the first and second organic layers to overlap the first and second pixel areas. The first organic layer includes first emission layers that emit first light and a charge generation layer disposed between the first emission layers. At least one of the first emission layers overlaps the first and second pixel areas.

14 Claims, 13 Drawing Sheets

(56) References Cited

U.S. PATENT DOCUMENTS

| | | | |
|---|---|---|---|
| 10,943,954 B2 | 3/2021 | Park et al. | |
| 11,258,032 B2 | 2/2022 | Yoon et al. | |
| 2010/0090241 A1* | 4/2010 | D'Andrade | H10K 59/35 |
| | | | 257/40 |
| 2011/0227125 A1 | 9/2011 | Tsutsui et al. | |
| 2011/0240970 A1 | 10/2011 | Park et al. | |
| 2015/0144926 A1* | 5/2015 | Lee | H10K 50/131 |
| | | | 257/40 |
| 2019/0189969 A1* | 6/2019 | Youn | H10K 50/852 |
| 2019/0326542 A1 | 10/2019 | Yang et al. | |
| 2020/0006692 A1 | 1/2020 | Seok et al. | |
| 2020/0358018 A1* | 11/2020 | Kim | H10K 59/32 |

FOREIGN PATENT DOCUMENTS

| | | |
|---|---|---|
| KR | 10-2018-0003710 A | 1/2018 |
| KR | 10-2018-0030295 A | 3/2018 |
| KR | 20180079104 A | 7/2018 |
| KR | 101929344 | 3/2019 |
| KR | 20190123829 | 11/2019 |
| KR | 102060018 | 12/2019 |
| KR | 20200001414 | 1/2020 |
| KR | 102196085 | 12/2020 |

\* cited by examiner

DISPLAY DEVICE HAVING COMMON SUB-EMISSION LAYERS OVERLAPPING DIFFERENT PIXEL AREAS

CROSS-REFERENCE TO RELATED APPLICATIONS

This application claims priority from and the benefit of Korean Patent Application No. 10-2020-0174105, filed on Dec. 14, 2020, which is hereby incorporated by reference for all purposes as if fully set forth herein.

BACKGROUND

Field

Embodiments of the invention relate generally to a display device and, more specifically, to a display device having improved lifespan.

Discussion of the Background

An organic light emitting device is a self-luminous device driven having a high response speed and driven at a low voltage. Thus, the organic light emitting display device including an organic light emitting element may not require a separate light source and thus may have various advantages of being lightweight and thin, having excellent luminance, and having no dependence in the particular viewing angle of a user viewing a display driven using an organic light emitting device.

The organic light emitting element is a display element having an emission layer made of an organic material between an anode electrode and a cathode electrode. Holes provided from the anode electrode and electrons provided from the cathode electrode are combined in the emission layer to form excitons, thereby generating light corresponding to energy between the holes and electrons from the excitons.

A tandem organic light emitting element has a structure in which two or more or plurality of stacks of a hole transport layer/emission layer/electron transport layer are provided between the anode electrode and the cathode electrode, and a charge generation layer that assists generation and movement of charges exists between the stacks.

The above information disclosed in this Background section is only for understanding of the background of the inventive concepts, and, therefore, it may contain information that does not constitute prior art.

SUMMARY

Devices constructed according to illustrative embodiments and implementations of the embodiments are capable of having an improved luminance lifespan and reduced defected during manufacturing by having a plurality of light emitting structure stacks provided in some light emitting elements of a plurality of light emitting elements, and one light emitting structure stack in the remaining light emitting elements.

The present disclosure provides a display device having an improved luminance lifespan and a reduced defect rate.

Additional features of the inventive concepts will be set forth in the description which follows, and in part will be apparent from the description, or may be learned by practice of the inventive concepts.

An embodiment provides a display device including: a substrate having a first pixel area configured to emit first light and a second pixel area configured to emit second light having an emission wavelength different from that of the first light; a first electrode disposed on the substrate to overlap the first pixel area and the second pixel area; a first organic layer disposed on the first electrode to overlap the first pixel area; a second organic layer disposed on the first electrode to overlap the second pixel area; and a second electrode disposed on the first organic layer and the second organic layer to overlap the first pixel area and the second pixel area, wherein the first organic layer includes a first hole transport region, a plurality of first emission layers configured to emit the first light, a charge generation layer disposed between the plurality of first emission layers, and a first electron transport region, which are disposed on the first electrode, and at least one of the plurality of first emission layers overlaps the first pixel area and the second pixel area.

The second organic layer may include a second hole transport region, a second emission layer configured to emit the second light, and a second electron transport region, which are sequentially disposed on the first electrode, and one second emission layer may be disposed on the first electrode.

The first light may be blue light, and the second light may be green light or red light.

In an embodiment, a third pixel area configured to third light having an emission wavelength different from that of each of the first light and the second light may be defined on the substrate, and the display device may further include a third organic layer disposed on the first electrode to overlap the third pixel area.

The third organic layer may include a third hole transport region, one third emission layer configured to emit the third light, and a third electron transport region, which are sequentially disposed on the first electrode, and one third organic layer may be disposed on the first electrode.

The first organic layer may include: a first sub-emission layer disposed between the first hole transport region and the charge generation layer; and a second sub-emission layer disposed between the charge generation layer and the first electron transport region.

The first sub-emission layer may overlap all the first pixel area to the third pixel area.

The second sub-emission layer may overlap all the first pixel area to the third pixel area.

Each of the first sub-emission layer and the second sub-emission layer may overlap all the first pixel area to the third pixel area.

The third organic layer may include a third emission layer configured to emit the third light, and the third emission layer may be disposed between the first sub-emission layer and the second sub-emission layer.

The charge generation layer may include: an n-type charge generation layer disposed adjacent to the first sub-emission layer; and a p-type charge generation layer disposed adjacent to the second sub-emission layer.

The first hole transport region may include a hole transport layer disposed under the plurality of first emission layers.

The first electron transport region may include an electron transport layer disposed under the plurality of first emission layers.

The display device may further include a capping layer disposed on the second electrode, wherein the capping layer may have a reflective index of about 1.6 or more.

In an embodiment, a display device includes: a substrate having a first pixel area configured to emit first light, a second pixel area configured to emit second light different from the first light, and a third pixel area configured to emit third light different from each of the first light and the second light; a first light emitting element configured to overlap the first pixel area; a second light emitting element configured to overlap the second pixel area; and a third light emitting element configured to overlap the third pixel area, wherein the first light emitting element includes a plurality of first emission layers configured to emit the first light, the second light emitting element includes one second emission layer configured to emit the second light, the third light emitting element includes one third emission layer configured to emit the third light, and at least one of the plurality of first emission layers overlaps the first pixel area, the second pixel area, and the third pixel area.

The first light may be blue light, and one of the first second light and the third light may be red light, and the other may be green light.

The first light emitting element may further include: a first electrode and a first hole transport region, which are disposed under the plurality of first emission layers; and a first electron transport region and a second electrode, which are disposed under the plurality of first emission layers.

The first light emitting element may further include a charge generation layer disposed between the plurality of first emission layers.

The second light emitting element may further include: a second hole transport region disposed under the second emission layer; and a second electron transport region disposed on the second emission layer.

The second light emitting element may further include an additional hole transport layer disposed between the second emission layer and the second hole transport region.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
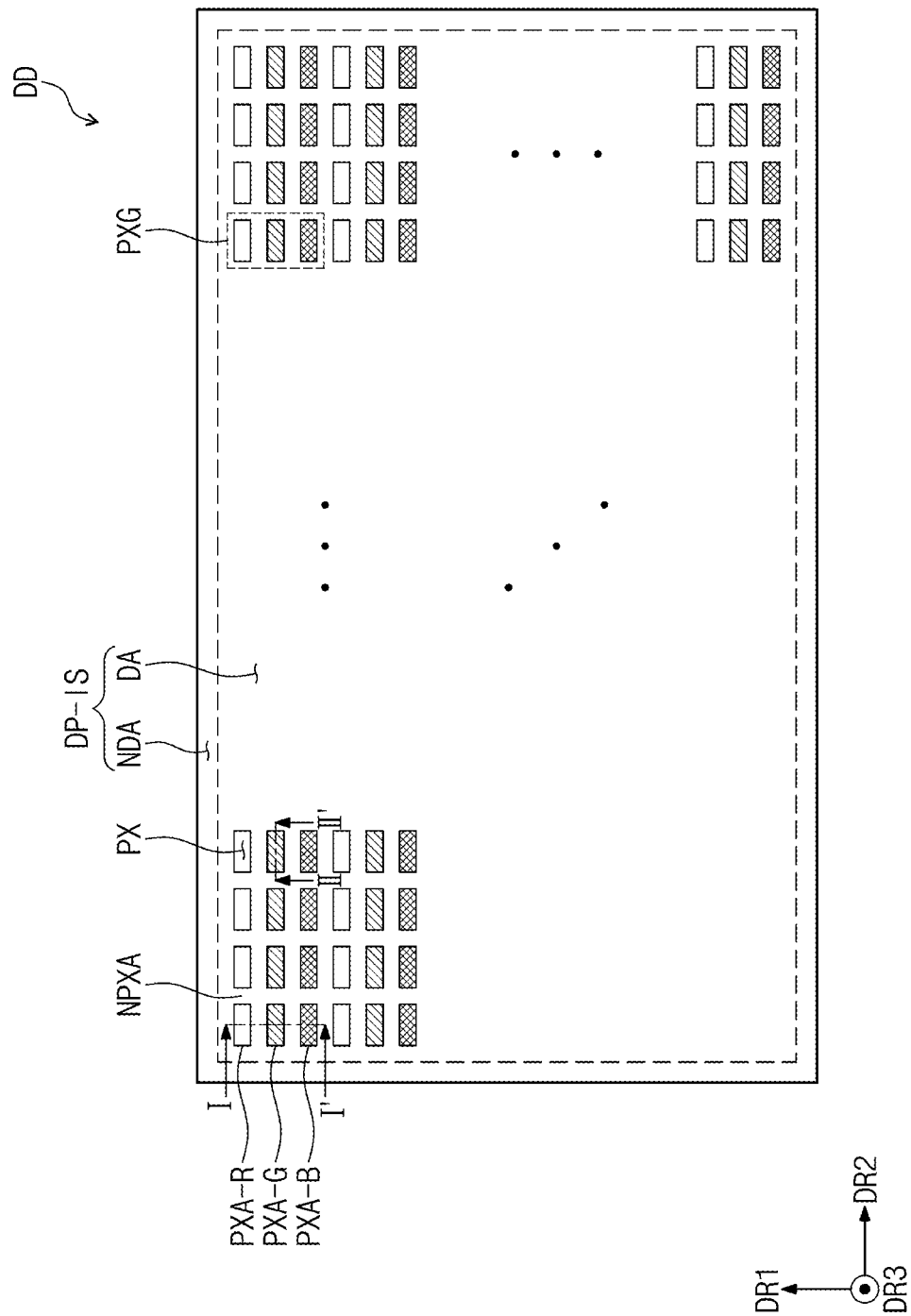
FIG. 1 is a plan view of a display device according to an embodiment of constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2A:
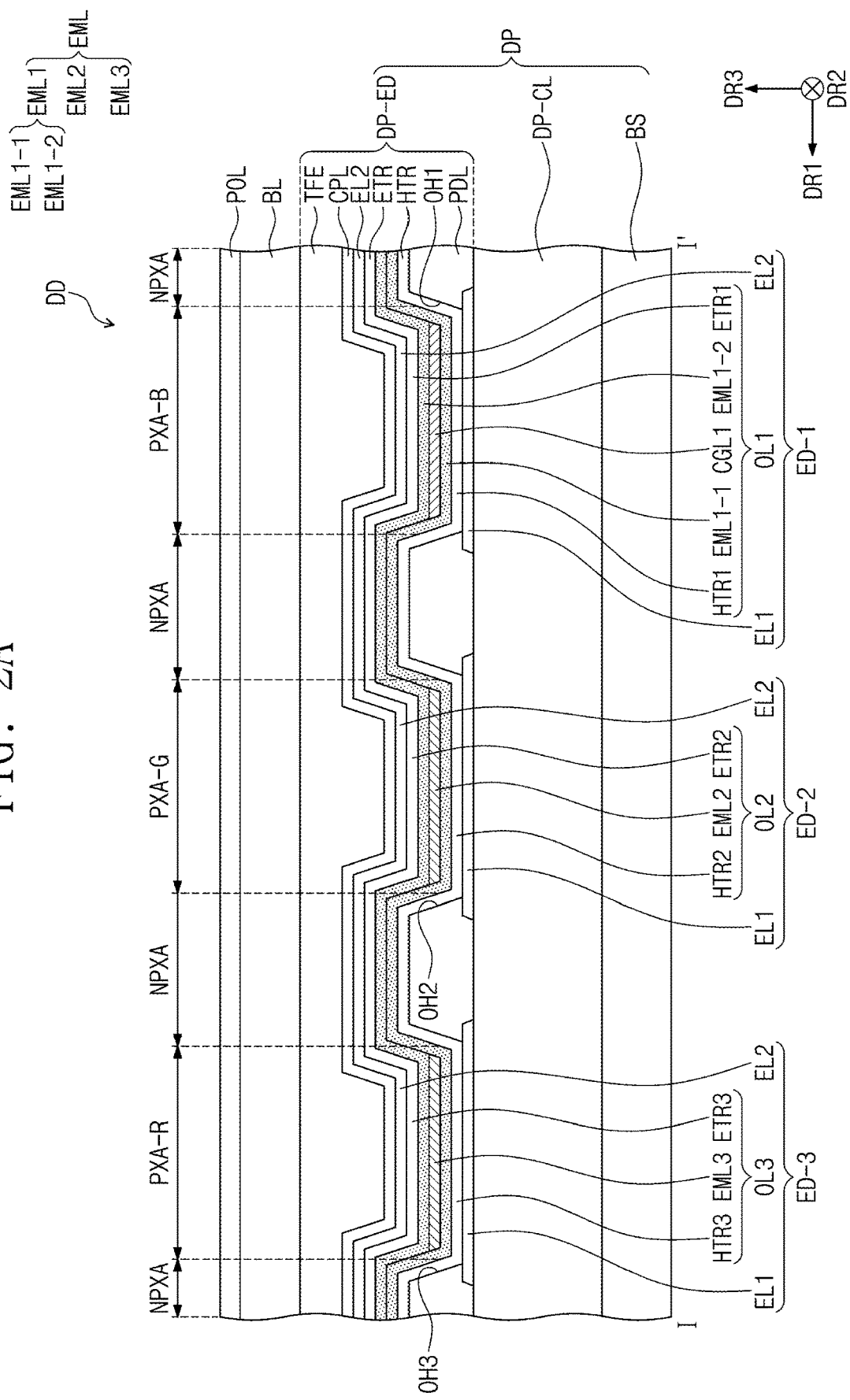
FIGS. 2A and 2B are cross-sectional views of the display device according to an embodiment.
Figure 2B:
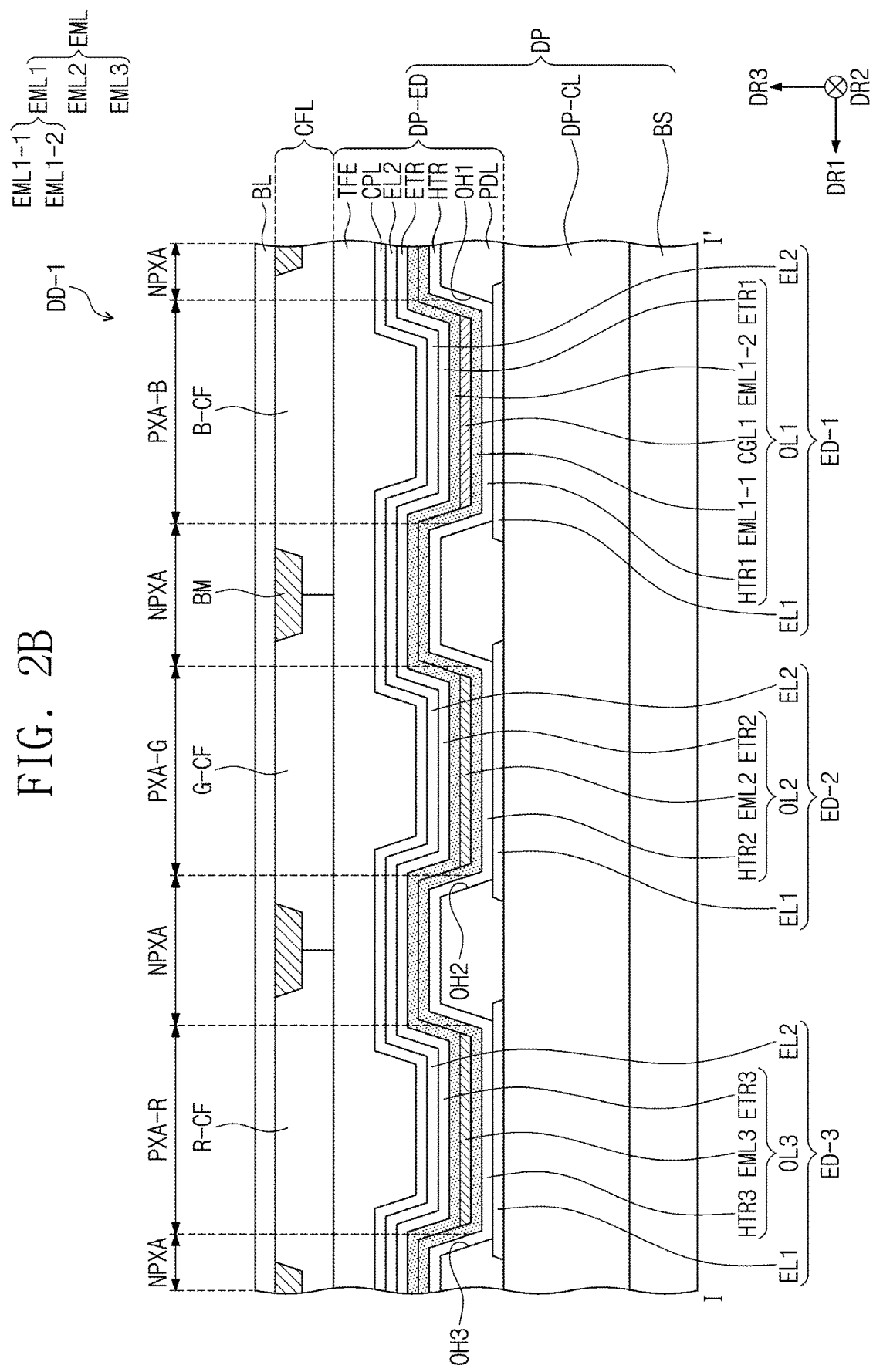

FIG. 1 is a plan view of a display device DD according to an embodiment constructed according to principles of the invention. FIGS. 2A and 2B are cross-sectional views of the display device DD according to an embodiment.

As illustrated in FIG. 1, the display device DD may display an image through a display surface DP-IS. The display surface DP-IS may be a surface that is parallel to a surface defined by a first direction DR1 and a second direction DR2 (which may respectively correspond to x, y and z axes of an x-y-z three axis coordinate system, for example). The display surface DP-IS may include a display area DA and a non-display area NDA. A non-pixel area NPXA and a pixel area PX may be defined on the display area DA. The pixel area PX may include a plurality of pixel areas PXA-R, PXA-G, and PXA-B. The non-pixel area NPXA may surround the pixel area PX.

The non-display area NDA is defined along an edge of the display surface DP-IS. The non-display area NDA is adjacent to the display area DA. The non-display area NDA may surround the display area DA.

A normal direction of the display surface DP-IS, i.e., a thickness direction of the display device DD may correspond to a third direction DR3. A front surface (or a top surface) and a rear surface (or a bottom surface) of each of layers or units, which will be described below, are distinguished by the third direction DR3. The front and rear surfaces may be opposite to each other in the third direction DR3. The directions indicated as the first to third directions DR1, DR2, and DR3 may be a relative concept and thus changed into different directions. Although the display device DD having a flat display surface DP-IS is illustrated in an embodiment, the embodiment is not limited thereto. The display device DD may include a curved display surface or a solid display surface. The solid display surface may include a plurality of display areas that indicate different directions.

FIGS. 2A and 2B are cross-sectional views of the display device DD, taken along line I-I' of FIG. 1. The display device DD according to an embodiment may include a plurality of light emitting elements ED-1, ED-2, and ED-3. For example, the plurality of light emitting elements ED-1, ED-2, and ED-3 may include a first light emitting element ED-1, a second light emitting element ED-2, and a third light emitting element ED-3. Each of the first light emitting element ED-1, the second light emitting element ED-2, and the third light emitting element ED-3 may include a first electrode EL1, a second electrode EL2, and an organic layer disposed between the first electrode EL1 and the second electrode EL2.

For example, the first light emitting element ED-1 includes a first organic layer OL1 disposed on the first electrode to overlap the first pixel area PXA-B. The second light emitting element ED-2 includes a second organic layer OL2 disposed on the first electrode to overlap the second pixel area PXA-G. The third light emitting element ED-3 includes a third organic layer OL3 disposed on the first electrode to overlap the third pixel area PXA-R.

One of the plurality of light emitting elements ED-1, ED-2, and ED-3 may include a plurality of emission layers EML1-1 and EML1-2, and each of other light emitting elements ED-2 and ED-3 may include one of the emission layers EML2 and EML3. In the display device DD according to an embodiment, the first light emitting element ED-1 includes two first emission layers EML1-1 and EML1-2 included in the first organic layer OL1, that is, a first sub-emission layer EML1-1 and a second sub-emission layer EML1-2. A charge generation layer CGL1 is disposed between the plurality of emission layers EML1-1 and EML1-2. For example, the charge generation layer CGL1 is disposed between the first sub-emission layer EML1-1 and the second sub-emission layer EML1-2. Although FIG. 2A illustrates that the first light emitting element ED-1 includes the two first emission layers EML1-1 and EML1-2, the embodiment is not limited thereto. For example, the first light emitting element ED-1 may include three or more emission layers. In one embodiment, the first light emitting element ED-1 may emit blue light.

The second light emitting element ED-2 includes one second emission layer EML2 included in the second organic layer OL2. For example, the second light emitting element ED-2 may include one second emission layer EML2, and the second emission layer EML2 may not include two or more second emission layers EML2. In an embodiment, the second light emitting element ED-2 may emit green light.

The third light emitting element ED-3 includes one third emission layer EML3 included in the third organic layer OL3. For example, the third light emitting element ED-3 may include one third emission layer EML3 and may not include two or more third emission layers EML3. The third light emitting element ED-3 may emit red light.

In an embodiment, at least one of the first sub-emission layer EML1-1 or the second sub-emission layer EML1-2, which are included in the first organic layer OL1 of the first light emitting element ED-1 may overlap the first pixel area to the third pixel area PXA-B, PXA-G, and PXA-R. For example, each of the first sub-emission layer EML1-1 and the second sub-emission layer EML1-2 may overlap the first to third pixel areas PXA-B, PXA-G, and PXA-R.

In one embodiment, the second emission layer EML2 included in the second organic layer OL2 of the second light emitting element ED-2 may overlap the second pixel area PXA-G, and the first pixel area PXA-B and the third pixel area PXA-R may not overlap each other. In the second pixel area PXA-G, the second emission layer EML2 may be disposed between the first sub-emission layer EML1-1 and the second sub-emission layer EML1-2.

In an embodiment, the third emission layer EML3 included in the third organic layer OL3 of the third light emitting element ED-3 may overlap the third pixel area PXA-R, and the first pixel area PXA-B and the second pixel area PXA-G may not overlap each other. In the third pixel area PXA-R, the third emission layer EML3 may be disposed between the first sub-emission layer EML1-1 and the second sub-emission layer EML1-2.

The first sub-emission layer EML1-1 and the second sub-emission layer EML1-2, which are included in the first light emitting element ED-1 may be entirely disposed on the first pixel area to third pixel area PXA-B, PXA-G, and PXA-R to increase in process of manufacturing the display device. Specifically, both the first sub-emission layer EML1-1 and the second sub-emission layer EML1-2 may be disposed to overlap the first to third pixel areas PXA-B, PXA-G, and PXA-R. Accordingly, a separate mask may not be required when manufacturing the plurality of first emission layers EML1. When compared to the display device, in which all of the plurality of first emission layers EML1 are disposed only on the first pixel area PXA-B, according to the related art, in the display device according to one or more embodiments, at least one of the plurality of first emission layers EML1 may be commonly disposed on the first pixel area to the third pixel area PXA-B, PXA-G, and PXA-R to increase in time and efficiency of the manufacturing process and minimize a defect rate, which may occur in a mask patterning process.

The display panel DP of the display device DD according to an embodiment may include a base layer BS, a circuit layer DP-CL disposed on the base layer, and a display element layer DP-ED disposed on the circuit layer DP-CL. The base layer BS may provide a base surface on which the circuit element layer DP-CL is disposed. The base layer BS may include a glass substrate, a metal substrate, a plastic substrate, and the like. However, this embodiment is not limited thereto.

In an embodiment, the circuit layer DP-CL may be disposed on the base layer BS. The circuit layer DP-CL may include a plurality of transistors (not shown). The transistors (not shown) may include a control electrode, an input electrode, and an output electrode, respectively. For example, the circuit layer DP-CL may include a switching transistor and a driving transistor, which are configured to drive the light emitting elements ED-1, ED-2, and ED-3 of the light emitting element layer DP-ED.

The display element layer DP-ED according to an embodiment includes pixel defining layers PDL, a plurality of light emitting elements ED-1, ED-2, and ED-3 disposed between the pixel defining layers PDL, and an encapsulation layer TFE disposed on each of the plurality of light emitting elements ED-1, ED-2, and ED-3.

In FIG. 2A, the emission layers EML2 and EML3 of the light emitting elements ED-2 and ED-3 are disposed in openings OH2 and OH3 defined in the pixel defining layer PDL, and the first emission layer EML1, first to third hole transport regions HTR1, HTR2, HTR3, first to third electron transport regions ETR1, ETR2, ETR3, and the second electrode EL2 are provided as common layers in the entire light emitting elements ED-1, ED-2, and ED-3. That is, each of the first hole transport region HTR1 included in the first light emitting element ED-1, the second hole transport region HTR2 included in the second light emitting element ED-2, and the third hole transport regions HTR3 included in the third light emitting element ED-3 may be partially disposed on the pixel defining layer PDL, and the first hole transport region HTR1, the second hole transport region HTR2, and the third hole transport region HTR3 may be connected to each other on the pixel defining layer PDL to form one hole transport region HTR having an integral shape. Also, each of the first electron transport region ETR1 included in the first light emitting element ED-1, the second electron transport region ETR2 included in the second light emitting element ED-2, and the third electron transport regions ETR3 included in the third light emitting element ED-3 may be at least partially disposed on the pixel definition layer PDL, and the first electron transport region ETR1, the second electron transport region ETR2, and the third electron transport region ETR3 may be connected to each other on the pixel defining layer PDL to form one electron transport region ETR having an integral shape. However, this embodiment is not limited thereto, and unlike the example illustrated in FIG. 2A, the electron transport region ETR and the hole transport region HTR may be patterned to be provided inside the openings OH1, OH2, and OH3 defined in the pixel defining layer PDL. For example, in an embodiment, the first to third hole transport regions HTR1, HTR2, HTR3 of the plurality of light emitting elements ED-1, ED-2, and ED-3, the plurality of emission layers EML1, EML2, and EML3, and the first to third electron transport regions ETR1, ETR2, ETR3, and the like may be patterned by inkjet printing so as to be provided inside the first to third openings OH1, OH2, and OH3, respectively.

The encapsulation layer TFE may cover the plurality of light emitting elements ED-1, ED-2, and ED-3. The encapsulation layer TFE may cover the display element layer DP-ED. The encapsulation layer TFE may be a thin film encapsulation layer. The encapsulation layer TFE may be provided as a single layer or a laminate in which a plurality of layers are laminated. The encapsulation layer TFE includes at least one insulating layer. The encapsulation layer TFE according to an embodiment may include at least one inorganic film (hereinafter, referred to as an encapsulation inorganic film). Also, the encapsulation layer TFE according to an embodiment may include at least one organic layer (hereinafter, referred to as an encapsulation organic film) and at least one encapsulation inorganic film.

The encapsulation inorganic film protects the display element layer DP-ED against moisture/oxygen, and the encapsulation organic film protects the display element layer DP-ED against foreign substances such as dust particles. The encapsulation inorganic film may include silicon nitride, silicon oxy nitride, silicon oxide, titanium oxide, or aluminum oxide, but is not limited thereto. The encapsulating organic film may include an acrylic compound, an epoxy compound, or the like. The encapsulation organic film may include an organic material capable of photopolymerization, but is not particularly limited.

The encapsulation layer TFE may be disposed on the second electrode EL2 and may be disposed to fill a portion of each of the openings OH1, OH2, and OH3.

Referring to FIGS. 1 and 2A, each of the pixel areas PXA-R, PXA-G, and PXA-B may be an area from which light generated from each of the plurality of light emitting elements ED-1, ED-2, and ED-3 is emitted. The plurality of pixel areas PXA-R, PXA-G, and PXA-B may be spaced apart from each other on a plane.

Each of the pixel areas PXA-R, PXA-G, and PXA-B may be an area divided by the pixel defining layer PDL. The non-pixel areas NPXA may be areas between the pixel areas PXA-R, PXA-G, and PXA-B adjacent to each other to correspond to the pixel defining layer 70. In this specification, each of the pixel areas PXA-R, PXA-G, and PXA-B may correspond to the pixel area. The pixel defining layer PDL may divide the plurality of light emitting elements ED-1, ED-2, and ED-3. The plurality of emission layers EML1-1, EML2, and EML3 of the plurality of light emitting elements ED-1, ED-2, and ED-3 may be disposed in the openings OH1, OH2, OH3 defined in the pixel defining layer PDL and thus be distinguished from each other.

The plurality of pixel areas PXA-R, PXA-G, and PXA-B may be divided into a plurality of groups according to the colors of the light generated from the plurality of light emitting elements ED-1, ED-2, and ED-3. In the display device DD according to an embodiment illustrated in FIGS. 1 and 2A, the three pixel areas PXA-R, PXA-G, and PXA-B, which emit the red light, the green light, and the blue light are illustrated as an example. For example, the display device DD according to an embodiment may include the first pixel area PXA-B, the second pixel area PXA-G, and the third pixel area PXA-R, which are distinguished from each other. In an embodiment, the first pixel area PXA-B may refer to a blue pixel area PXA-B, the second pixel area PXA-G may refer to a green pixel area PXA-G, and the third pixel area PXA-R may refer to a red pixel area PXA-R. In the display device DD according to an embodiment, one red pixel area PXA-R, one green pixel area PXA-G, and one blue pixel area PXA-B may be grouped to refer to a unit pixel group PXG. At least one of the red pixel areas PXA-R, the green pixel areas PXA-G, or the blue pixel areas PXA-B, which are included in the unit pixel group PXG, may be provided in plurality. For example, the unit pixel group PXG may include two green pixel areas PXA-G, one red pixel area PXA-R, and one blue pixel area PXA-B.

In the display device DD according to an embodiment, the light emitting elements ED-1, ED-2, and ED-3 may emit light having different wavelength regions. For example, in an embodiment, the display device DD may include the first light emitting element ED-1 that emits the red light, the second light emitting element ED-2 that emits the green light, and the third light emitting element ED-3 that emits the blue light. That is, the red pixel area PXA-R, the green pixel area PXA-G, and the blue pixel area PXA-B of the display device DD may correspond to the first light emitting element ED-1, the second light emitting area ED-2, and the third light emitting element ED-3, respectively.

The plurality of pixel areas PXA-R, PXA-G, and PXA-B in the display device DD according to an embodiment may be arranged in a stripe shape. Referring to FIG. 1, the plurality of red pixel areas PXA-R, the plurality of green pixel areas PXA-G, and the plurality of blue pixel areas PXA-B are respectively arranged in the second direction DR2. Also, the red pixel areas PXA-R, the green pixel areas PXA-G, and the blue pixel areas PXA-B may be alternately arranged sequentially in the first direction DR1.

FIGS. 1 and 2A illustrate that all surface areas of the pixel areas PXA-R, PXA-G, and PXA-B are similar to each other, but this embodiment is not limited thereto. For example, surface areas of the pixel areas PXA-R PXA-G and PXA-B may be different from each other according to the wavelength ranges of the emitted light. Each of the surface areas of the pixel areas PXA-R, PXA-G, and PXA-B may denote a surface area when viewed on a plane defined by the first direction DR1 and the second direction DR2.

The arrangement of the pixel areas PXA-R, PXA-G, and PXA-B is not limited to that illustrated in FIG. 1. For example, of the arrangement of the red pixel area PXA-R, the green pixel area PXA-G, and the blue pixel areas PXA-B may be provided in various combinations according to characteristics of the display quality required by the display device DD. For example, the arrangement of the pixel areas PXA-R, PXA-G, and PXA-B may be arranged in a pentile shape or a diamond shape.

The display device DD according to an embodiment may include a base substrate BL and a polarizing layer POL, which are disposed on the display panel DP. However, the embodiment described herein is not limited thereto.

The base substrate BL may be a glass substrate, a metal substrate, or a plastic substrate. The base substrate BL may be a member that provides a base surface on which the polarizing layer POL or the like is disposed.

The display device DD according to an embodiment may further include the polarizing layer POL. The polarizing layer POL may block external light incident into the display device DD from the outside. The polarizing layer POL may block some of the external light. Also, the polarizing layer POL may reduce reflected light generated from the display panel DP by the external light. That is, the polarizing layer POL may be an antireflection layer. For example, the polarizing layer POL may function to block the reflected light when light incident from the outside of the display device DD is incident into the display panel DP and then emitted again from the display panel DP.

In FIG. 2A, the polarizing layer POL may be disposed on the base substrate BL so as to be exposed, but this embodiment is not limited thereto. For example, the polarizing layer POL may be disposed under the base substrate BL.

FIG. 2A illustrates that the display device DD includes the polarizing layer POL, but this embodiment is not limited thereto. For example, and the polarizing layer POL may be omitted. For example, as illustrated in FIG. 2B, in an embodiment, a display device DD-1 may not include the polarizing layer, but may include a color filter layer CFL as the antireflection layer. The color filter layer CFL may include color filter parts CF-R, CF-G, and CF-B, which respectively correspond to the red pixel areas PXA-R, green pixel areas PXA-G, and blue pixel areas PXA-B. The color filter layer CFL includes a red color filter part CF-R overlapping the red pixel area PXA-R, a green color filter part CF-G overlapping the green pixel area PXA-G, and a blue color filter part CF-B overlapping the blue pixel area PXA-B. The color filter layer CFL may overlap the non-pixel areas NPXA and may include a light blocking part BM disposed between the color filter parts CF-R, CF-G, and CF-B.

Figure 3:
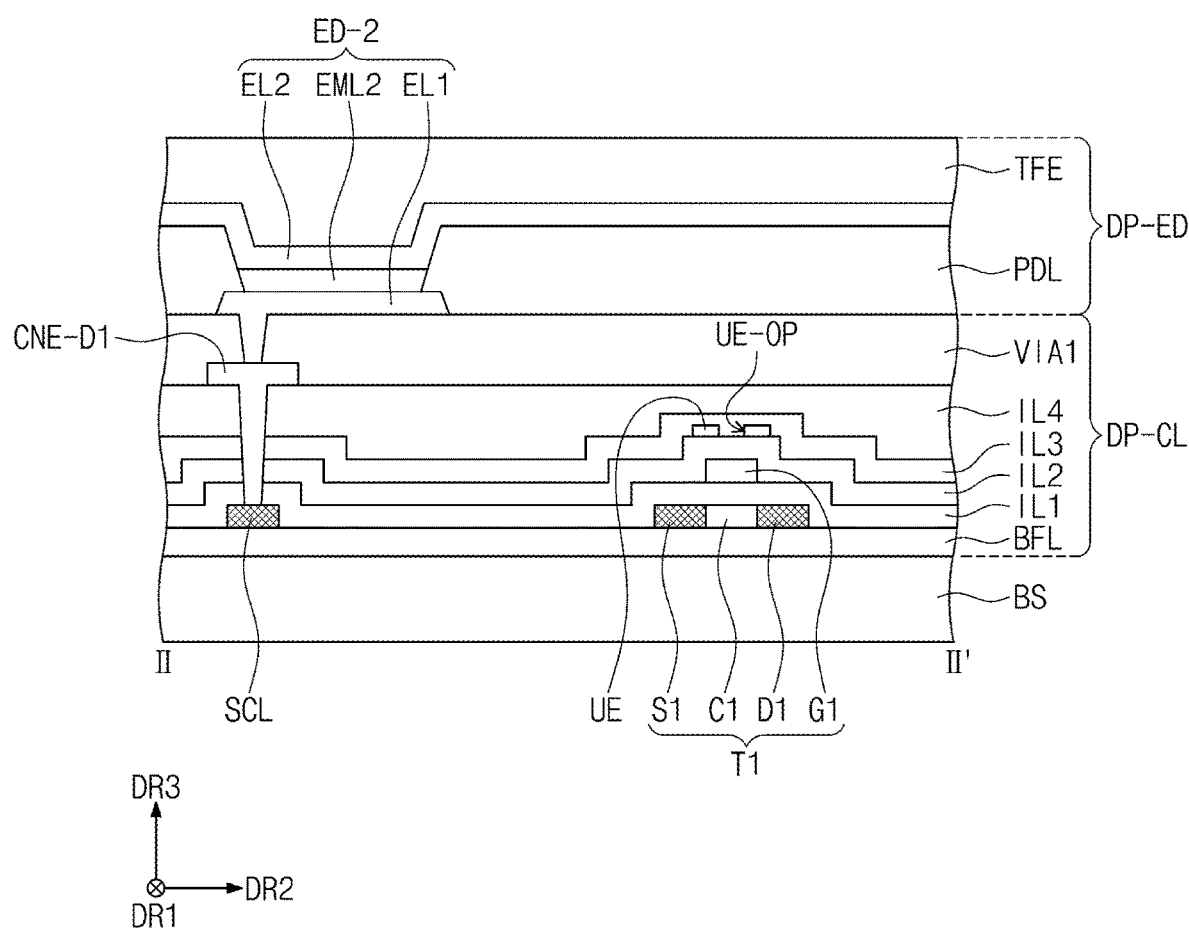
FIG. 3 is a cross-sectional view of the display device according to an embodiment.

FIG. 3 is a cross-sectional view of the display device according to an embodiment. FIG. 3 is a cross-sectional view illustrating a portion corresponding to line II-IF of FIG. 1.

Referring to FIG. 3, the circuit layer DP-CL of the display device DD may include a buffer layer BFL, a first insulating layer ILL a second insulating layer IL2, a third insulating layer IL3, a fourth insulating layer IL4, and a fifth insulating layer VIA1.

In an embodiment, each of the first to third insulating layers ILL IL2, and IL3 includes an organic layer and/or an inorganic layer. In an embodiment, each of the first to third insulating layers ILL IL2, and IL3 may include a plurality of inorganic thin films. The plurality of inorganic thin films may include a silicon nitride layer and a silicon oxide layer. Each of the fourth insulating layer IL4 and the fifth insulating layer VIA1 may include an organic material.

The buffer layer BFL may be disposed on the base layer BS. The buffer layer BFL may include a single layer or a plurality of layers. The buffer layer BFL prevents impurities existing on the base layer BS from being introduced into the pixel area PX. Particularly, diffusion of the impurities into the transistor T1 constituting the pixel area PX is prevented. The impurities may be introduced from the outside or generated while the base substrate BS is pyrolyzed. The impurities may be a gas or sodium discharged from the base substrate BS. Also, the buffer layer BFL may block moisture introduced from the outside into the pixel area PX.

A transistor T1 including a semiconductor pattern may be disposed on the buffer layer BFL. As illustrated in FIG. 3, a source S1, an active A1, a drain D1, and a control electrode G1 of the first transistor T1 are formed from the semiconductor pattern. FIG. 3 illustrates a portion of a connection signal line SCL formed from the semiconductor pattern. Although not shown separately, the connection signal line SCL may be connected to another transistor (for example, a driving transistor) constituting the pixel driving circuit on a plane.

The first insulating layer IL1 may cover the source S1, the active C1, the drain D1, and the connection signal line SCL of the transistor T1. The control electrode G1 may be disposed between the first insulating layer IL1 and the second insulating layer IL2. An upper electrode UE may be disposed between the second insulating layer IL2 and the third insulating layer IL3. An opening UE-OP may be defined in the upper electrode UE.

A connection electrode CNE1 may be disposed on the fourth insulating layer IL4. The connection electrode CNE1 may be connected to the connection signal line SCL through a through-hole. The connection electrode CNE1 may connect the connection signal line SCL to the first electrode EL1.

As illustrated in FIG. 3, the display element layer DP-ED may include a light emitting element ED-2 and a pixel defining layer PDL. The light emitting element ED-2 may include a first electrode EL1, a second emission layer EML2, and a second electrode EL2. Only the first electrode EL1, the second emission layer EML2, and the second electrode EL2, which are some components included in the light emitting element ED-2, are illustrated in FIG. 3, and the hole transport region and the electron transport region are omitted.

The first electrode EL1 may be disposed on the fifth insulating layer VIA1. The first electrode EL1 may be connected to the connection signal line SCL through the through-hole. For example, the connection electrode CNE1 may electrically connect the connection signal line SCL to the first electrode EL1.

The pixel defining layer PDL may be disposed on the fifth insulating layer VIA1 to expose at least a portion of the first electrode EL1. The second emission layer EML2 may be disposed on the first electrode EL1. The second electrode EL2 may be disposed on the second emission layer EML2.

When the light emitting element ED-2 is an organic light emitting diode (OLED), the second emission layer EML2 may include an organic material. The encapsulation layer TFE may seal the light emitting element ED-2 to protect the light emitting element ED-2 from external oxygen or moisture. The encapsulation layer TFL may be a layer in which an organic film and an inorganic film are mixed.

However, this embodiment is not limited thereto, and conductive patterns including a metal may be further disposed on the second insulating layer IL2 and the third insulating layer IL3.

Figure 4A:
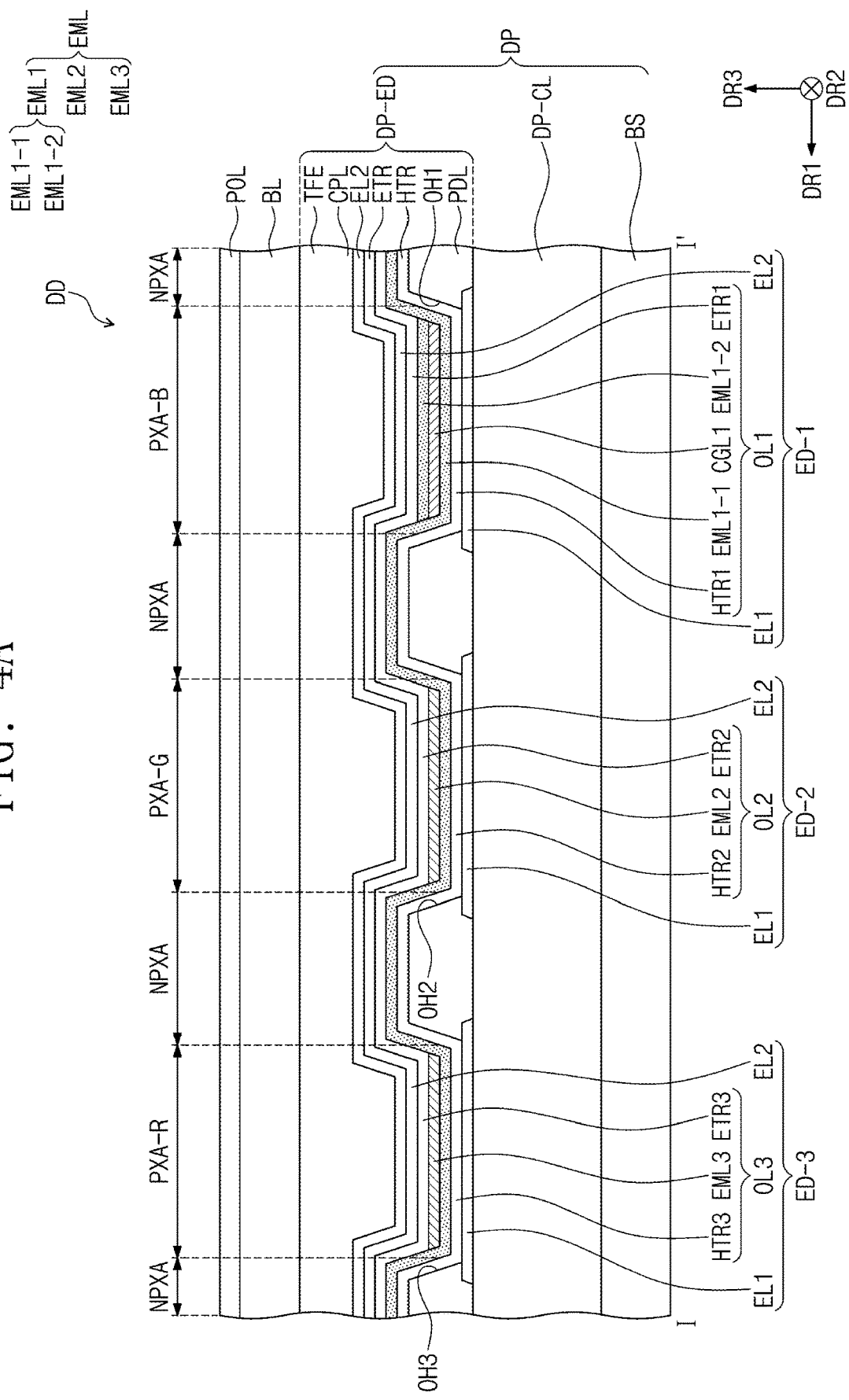
FIGS. 4A and 4B are cross-sectional views of the display device according to an embodiment.
Figure 4B:
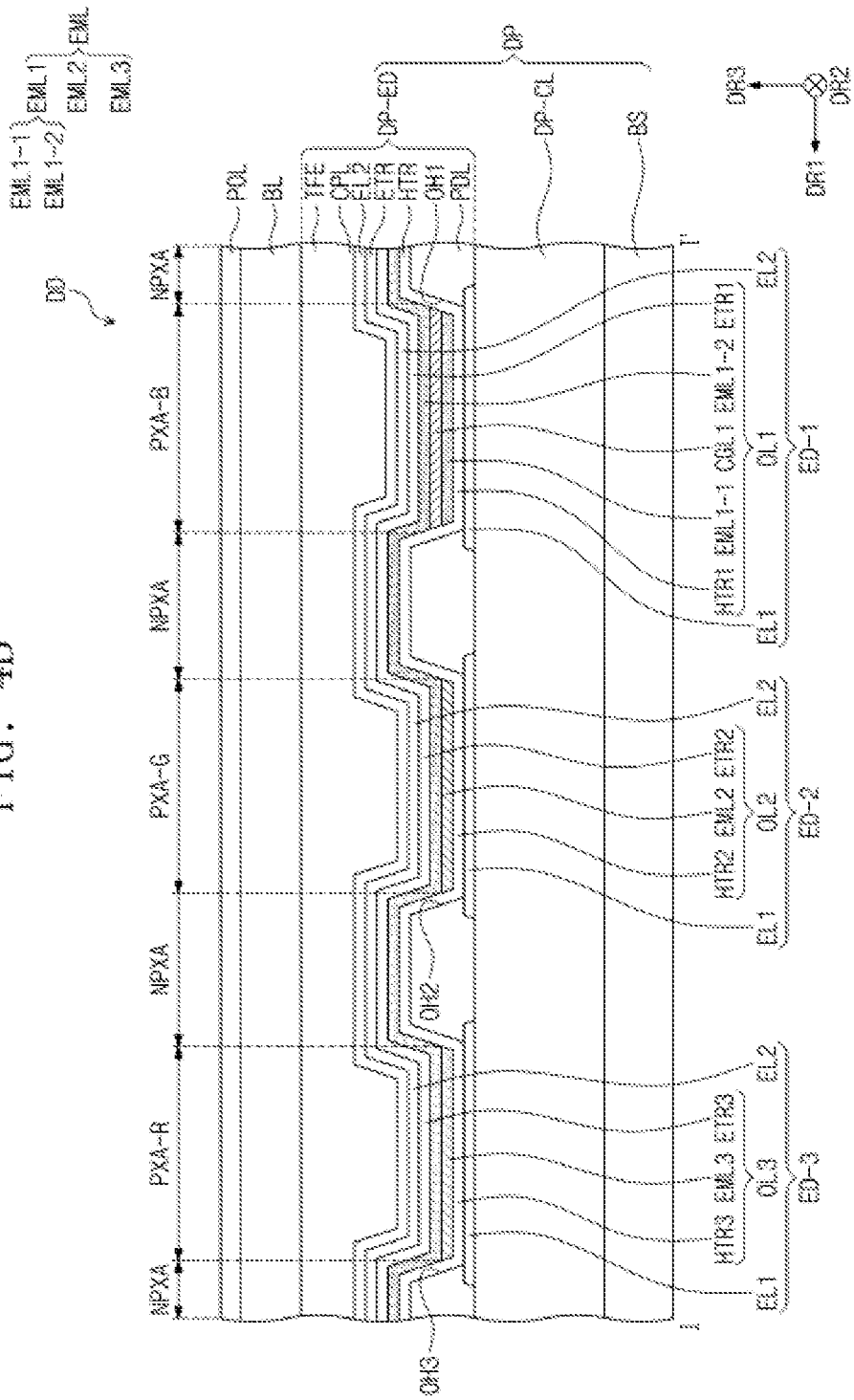

FIGS. 4A and 4B are schematic cross-sectional views of the display device DD according to an embodiment.

FIGS. 4A and 4B illustrate cross-sectional views of the display devices, in which the light emitting elements including the plurality of emission layers are different from each other as illustrated in FIGS. 2A and 2B, in the cross-section of the display device, which corresponds to the line I-I' of FIGS. 2A and 2B. Hereinafter, in description of the display device FIGS. 4A and 4B according to an embodiment, the same reference numerals are assigned to the same components as those described above, and detailed descriptions will be omitted for ease in explanation of these figures.

Referring to FIG. 4A, at least one of the plurality of first emission layers EML1-1 and EML1-2 included in the first organic layer OL1 of the first light emitting element ED-1 may overlap the first to third pixel areas PXA-B, PXA-G, and PXA-R. That is, at least one of the plurality of first emission layers EML1-1 and EML1-2 may be included in all of the first to third light emitting elements ED-1, ED-2, and ED-3. That is, for example, the first sub-emission layer EML1-1 of the plurality of first emission layers EML1-1 and EML1-2 may overlap the first to third pixel areas PXA-B, PXA-G, and PXA-R. The second sub-emission layer EML1-2 may overlap the first pixel area PXA-B and may not overlap the second pixel area PXA-G and the third pixel area PXA-R.

In one embodiment, the second emission layer EML2 included in the second organic layer OL2 of the second light emitting element ED-2 may overlap the second pixel area PXA-G, and the first pixel area PXA-B and the third pixel area PXA-R may not overlap each other. In the second pixel area PXA-G, the first sub-emission layer EML1-1 may be disposed under the second emission layer EML2. For example, the first sub-emission layer EML1-1 may be disposed between the second emission layer EML2 and the second hole transport region HTR2. However, this embodiment is not limited thereto, and the order of the first sub-emission layer EML1-1 and the second hole transport region HTR2 may be changed.

In an embodiment, the third emission layer EML3 included in the third organic layer OL3 of the third light emitting element ED-3 may overlap the third pixel area PXA-R, and the first pixel area PXA-B and the second pixel area PXA-G may not overlap each other. In the third pixel area PXA-R, the first sub-emission layer EML1-1 may be disposed under the third emission layer EML3. For example, the first sub-emission layer EML1-1 may be disposed between the third emission layer EML3 and the third hole transport region HTR3. However, an embodiment is not limited thereto, and the order of the first sub-emission layer EML1-1 and the third hole transport region HTR3 may be changed.

Referring to FIG. 4B, at least one of the plurality of first emission layers EML1-1 and EML1-2 included in the first organic layer OL1 of the first light emitting element ED-1 may overlap the first to third pixel areas PXA-B, PXA-G, and PXA-R. For example, the first sub-emission layer EML1-1 of the plurality of first emission layers EML1-1 and EML1-2 may overlap the first pixel area PXA-B and may not overlap the second pixel area PXA-G and the third pixel area PXA-R. The second sub-emission layer EML1-2 may overlap the first to third pixel areas PXA-B, PXA-G, and PXA-R.

In the second pixel area PXA-G, the second sub-emission layer EML1-2 may be disposed on the second emission layer EML2. For example, the second sub-emission layer EML1-2 may be disposed between the second emission layer EML2 and the second electron transport region ETR2. However, this embodiment is not limited thereto, and the order of the second sub-emission layer EML1-2 and the second electron transport region ETR2 may be changed.

In the third pixel area PXA-R, the second sub-emission layer EML1-2 may be disposed on the third emission layer EML3. For example, the second sub-emission layer EML1-2 may be disposed between the third emission layer EML3 and the third electron transport region ETR3. However, this embodiment is not limited thereto, and the order of the second sub-emission layer EML1-2 and the third electron transport region ETR3 may be changed.

Figure 5:
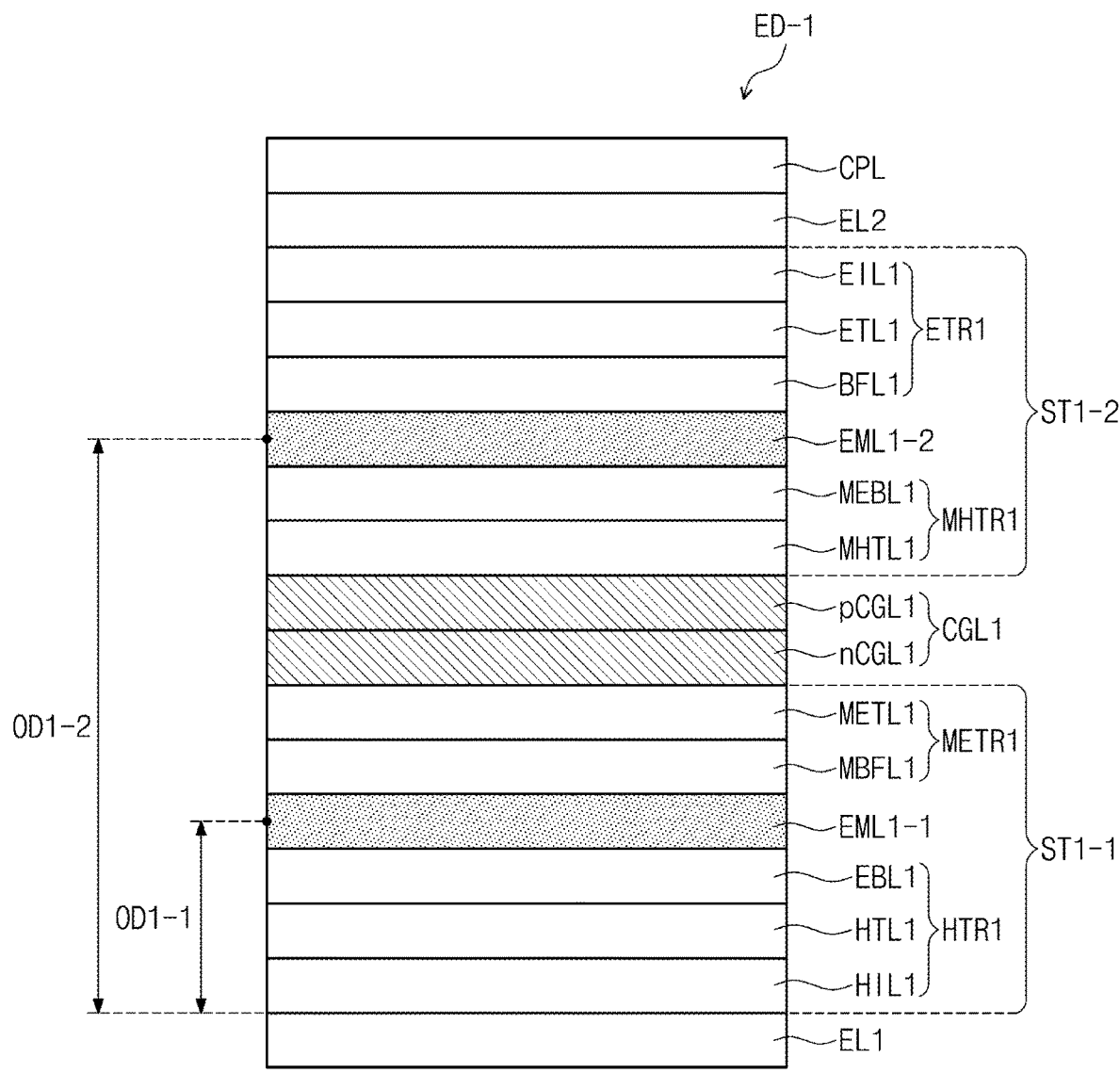
FIG. 5 is a cross-sectional view of a first light emitting element according to an embodiment.

FIG. 5 is a cross-sectional view of a first light emitting element ED-1 according to an embodiment.

Referring to FIG. 5, the first light emitting element ED-1 according to an embodiment includes a first electrode EL1, a second electrode EL2 facing the first electrode EL1, and a plurality of light emitting unit structures ST1-1 and ST1-2 disposed between the first electrode EL1 and the second electrode EL2. The light emitting element ED-1 according to an embodiment may include a first light emitting unit structure ST1-1 and a second light emitting unit structure ST1-2, which are disposed between the first electrode EL1 and the second electrode EL2 and a charge generation layer CGL1 disposed between the first light emitting unit structure ST1-1 and the second light emitting unit structure ST1-2.

Each of the first light emitting unit structure ST1-1 and the second light emitting unit structure ST1-2 includes a first emission layer EML1 that emits first light. The first light emitting unit structure ST1-1 may include a first sub-emission layer EML1-1 that emits first light, a first hole transport region HTR1 through which holes provided from the first electrode EL1 are transported to the first sub-emission layer EML1-1, and a first intermediate electron transport region METR1 through which electrons generated from the charge generation layer CGL1 are transported to the first sub-emission layer EML1-1.

The second light emitting unit structure ST1-2 may include a second sub-emission layer EML1-2 that emits the first light, a first intermediate hole transport region MHTR1 through which holes generated from the charge generation layer CGL1 are transported to the second sub-emission layer EML1-2, and a first electron transport region ETR1 through which electrons provided from the second electrode EL2 are transported to the second sub-emission layer EML1-2.

The first hole transport region HTR1 may include a first hole injection layer HIL1 disposed on the first electrode EL1, a first hole transport layer HTL1 disposed on the first hole injection layer HILL and a first hole-side additional layer EBL1 disposed on the first hole transport layer HTL1. The first hole-side additional layer EBL1 may include at least one of a hole buffer layer, an emission auxiliary layer, and an electron blocking layer. The hole buffer layer may be a layer that compensates for a resonance distance according to a wavelength of light emitted from the emission layer to increase in light emitting efficiency. The electron blocking layer may be a layer that serves to prevent the electrons from being injected from the electron transport region to the hole transport region. The first hole-side additional layer EBL1 may be in contact with the first sub-emission layer EML1-1. However, this embodiment is not limited thereto, and the first hole-side additional layer EBL1 may be omitted, and the first hole transport layer HTL1 may be in contact with the first sub-emission layer EML1-1.

The first intermediate electron transport region MTR1 may include a first intermediate electron-side additional layer MBFL1 disposed on the first sub-emission layer EML1-1 and a first intermediate electron transport layer METL1 disposed on the first intermediate electron-side additional layer MBFL1. The first intermediate electron-side additional layer MBFL1 may include at least one of an electron buffer layer or a hole blocking layer. The first intermediate electron-side additional layer MBFL1 may be in contact with the first sub-emission layer EML1-1. However, this embodiment is not limited thereto, and the first intermediate electron-side additional layer MBFL1 may be omitted. Also, the first intermediate electron injection layer may be disposed between the first intermediate electron transport layer METL1 and the charge generation layer CGL1.

The first intermediate hole transport region MHTR1 may include a first intermediate hole transport layer MHTL1 disposed on the charge generation layer CGL1 and a first intermediate hole-side additional layer MEBL1 disposed on the first intermediate hole transport layer MHTL1. The first intermediate hole-side additional layer MEBL1 may include at least one of a hole buffer layer, an emission auxiliary layer, or an electron blocking layer. The first intermediate hole-side additional layer MEBL1 may be in contact with the second sub-emission layer EML1-2. However, this embodiment is not limited thereto. For example, the first intermediate hole-side additional layer MEBL1 may be omitted, and the first intermediate hole transport layer MHTL1 may be in contact with the second sub-emission layer EML1-2. Also, the first intermediate hole injection layer may be disposed between the charge generation layer CGL1 and the first intermediate hole transport layer MHTL1.

The first electron transport region ETR1 may include a first electron-side additional layer BFL1 disposed on the second sub-emission layer EML1-2, a first electron transport layer ETL1 disposed on the first electron-side additional layer BFL1, and a first electron injection layer EIL1 disposed on the first electron transport layer ETL1. The first electron-side additional layer BFL1 may include at least one of an electron buffer layer or a hole blocking layer. The first electron-side additional layer BFL1 may be in contact with the second sub-emission layer EML1-2. However, this embodiment is not limited thereto. For example, the first electron-side additional layer BFL1 may be omitted, and the first electron transport layer ETL1 may be in contact with the second sub-emission layer EML1-2.

The charge generation layer CGL1 may be provided between the first light emitting unit structure ST1-1 and the second light emitting unit structure ST1-2. When a voltage is applied to the charge generation layer CGL1, charges (electrons and holes) may be generated by forming an adhesive agent through an oxidation-reduction reaction. The charge generation layer CGL1 may provide the generated charges to each of the adjacent light emitting unit structures ST1 and ST2. The charge generation layer CGL1 may double current efficiency, which occurs in each of the light emitting unit structure ST1 and ST2, and may serve to control balance of the charges between the first light emitting unit structure ST1-1 and the second light emitting unit structure ST1-2.

The charge generation layer CGL1 may have a layer structure in which a first sub-charge generation layer nCGL1 and a second sub-charge generation layer pCGL1 are bonded to each other. For example, the first sub-charge generation layer nCGL1 may be an n-type charge generation layer disposed adjacent to the first light emitting unit structure ST1 to provide the electrons to the first light emitting unit structure ST1. The second sub-charge generation layer pCGL1 may be a p-type charge generation layer disposed adjacent to the second light emitting unit structure ST2 to provide the holes to the second light emitting unit structure ST2. Although not shown, the buffer layer may be further disposed between the first sub-charge generation layer nCGL1 and the second sub-charge generation layer pCGL1.

The charge generation layer CGL1 may include an n-type aryl amine-based material or p-type metal oxide. For example, the charge generation layer CGL1 may include a charge generation compound made of an aryl amine-based organic compound, a metal, oxide, carbide, or fluoride of the metal, or a mixture thereof.

For example, the aryl amine-based organic compound may be α-NPD, 2-TNATA, TDATA, MTDATA, sprio-TAD, or sprio-NPB. For example, the metal may be cesium (Cs), molybdenum (Mo), vanadium (V), titanium (Ti), tungsten (W), barium (Ba), or lithium (Li). Also, for example, the oxide, the carbide, and the fluoride of the metal may be Re2O7, MoO3, V2O5, WO3, TiO2, Cs2CO3, BaF, LiF, or CsF.

In the first light emitting element ED-1, each of the plurality of emission layers EML1-1 and EML1-2 may have different optical distances, which are spaced apart from the first electrode EL1. In this specification, the "optical distance" may refer to a distance at which light generated by the emission layer is reflected from a reflective interface to cause resonance. As described herein, the optical distance of the emission layer may refer to a minimum distance from a center of the emission layer to a top surface of the first electrode EL1, which is the reflective interface. The emission center of the emission layer may be a point at which a thickness of the emission layer becomes about ½.

In an embodiment, the first sub-emission layer EML1-1 may be disposed at a point having a first optical distance OD1-1, and the second sub-emission layer EML1-2 may be disposed at a point having a second optical distance OD1-2. The first optical distance OD1-1 may be a distance at which the first light generated in the first sub-emission layer EML1-1 resonates at an n-th order. The second optical distance OD1-2 may be a distance at which the first light generated in the second sub-emission layer EML1-2 resonates at an (n+a)-th order. In this specification, each of reference symbols 'n' and 'a' may independently be an integer equal to or greater than 1. For example, the first sub-emission layer EML1-1 may be disposed to be spaced apart from the first electrode EL1 by a distance at which the first light primarily resonates, and the second sub-emission layer EML1-2 may be disposed to be spaced apart from the first electrode EL1 by a distance at which the first light secondarily resonates. Alternatively, the first sub-emission layer EML1-1 may be disposed to be spaced apart from the first electrode EL1 by a distance at which the first light secondarily resonates, and the second sub-emission layer EML1-2 may be disposed to be spaced apart from the first electrode EL1 by a distance at which the first light tertiarily resonates. However, this embodiment is not limited thereto. For example, the first sub-emission layer EML1-1 may be disposed to be spaced apart from the first electrode EL1 by a distance at which the first light primarily resonates, and the second sub-emission layer EML1-2 may be disposed to be spaced apart from the first electrode EL1 by a distance at which the first light tertiarily resonates.

In the first light emitting element ED-1 having a tandem structure including the plurality of emission layers EML1-1 and EML1-2 and the charge generation layer CGL1 disposed between the plurality of emission layers EML1-1 and EML1-2, the optical distance of each of the plurality of emission layers EML-1 and EML1-2 may be controlled to realize high efficiency and improved luminance lifespan.

Figure 6A:
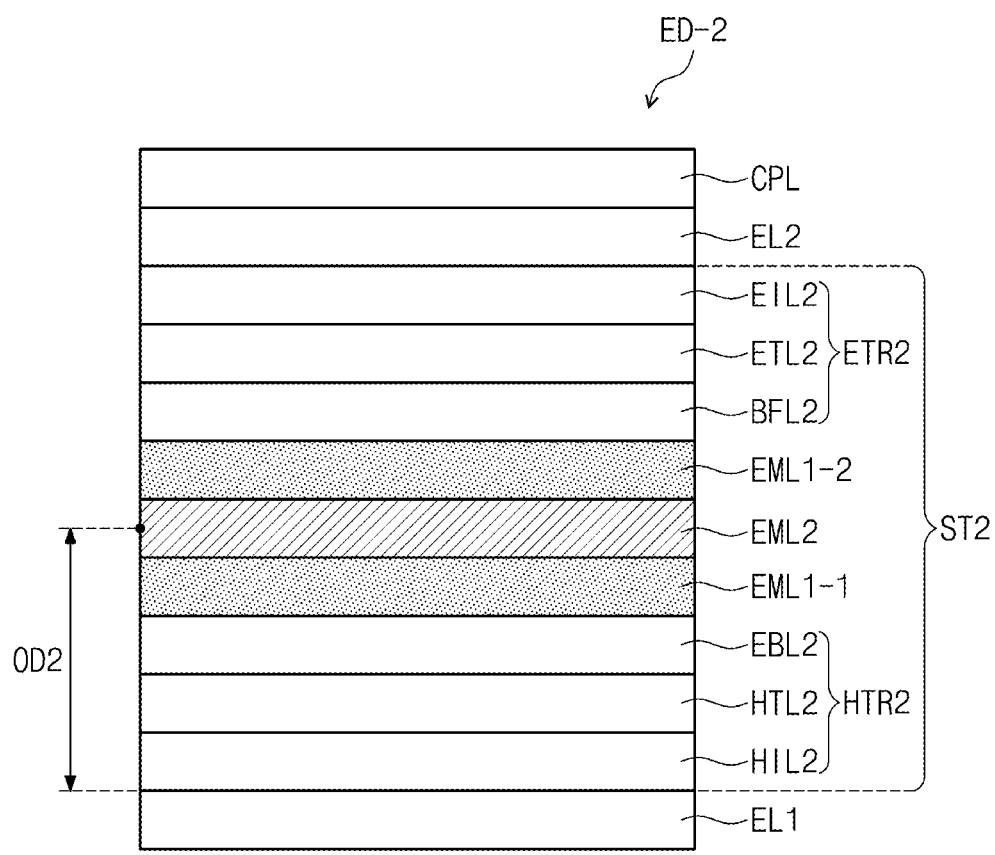
FIGS. 6A and 6B are cross-sectional views of a second light emitting element according to an embodiment.
Figure 6B:
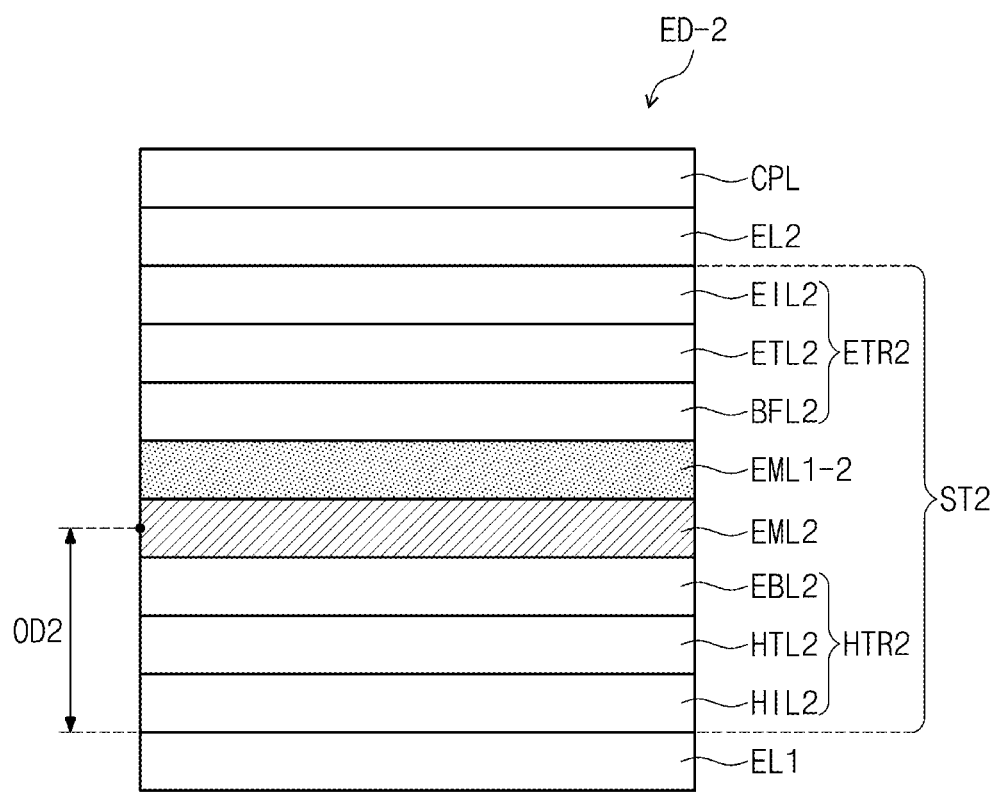

FIGS. 6A and 6B are cross-sectional views of a second light emitting element ED-2 according to an embodiment.

Referring to FIG. 6A, the second light emitting element ED-2 according to an embodiment includes a first electrode EL1, a second electrode EL2 facing the first electrode EL1, and one second light emitting unit structure ST2 disposed between the first electrode EL1 and the second electrode EL2.

The second light emitting unit structure ST2 includes a second emission layer EML2 that emits second light. The second light emitting unit structure ST2 may include a second emission layer EML2 that emits the second light, a second hole transport region HTR2 through which holes provided from the first electrode EL1 are transported to the second emission layer EML2, and a second electron transport region ETR2 through which electrons provided from the second electrode EL2 are transported to the second emission layer EML2.

The second hole transport region HTR2 may include a second hole injection layer HIL2 disposed on the first electrode EL1, a second hole transport layer HTL2 disposed on the second hole injection layer HIL2, and a second hole-side additional layer EBL2 disposed on the second hole transport layer HTL2. The second hole-side additional layer EBL2 may include at least one of a hole buffer layer, an emission auxiliary layer, or an electron blocking layer. The second hole-side additional layer EBL2 may be in contact with the second emission layer EML2. However, this embodiment is not limited thereto. For example, the second hole-side additional layer EBL2 may be omitted, and the second hole transport layer HTL2 may be in contact with the second emission layer EML2.

The second electron transport region ETR2 may include a second electron-side additional layer BFL2 disposed on the second emission layer EML2, a second electron transport layer ETL2 disposed on the second electron-side additional layer BFL2, and a second electron injection layer EIL2 disposed on the second electron transport layer ETL2. The second electron-side additional layer BFL2 may include at least one of an electron buffer layer or a hole blocking layer. The second electron-side additional layer BFL2 may be in contact with the second emission layer EML2. However, this embodiment is not limited thereto. For example, the second electron-side additional layer BFL2 may be omitted, and the second electron transport layer ETL2 may be in contact with the second emission layer EML2.

In an embodiment, at least one of the plurality of first emission layers EML1-1 and EML1-2 included in the first light emitting element ED-1 (see FIG. 2A) overlaps the first to third pixel areas PXA-B, PXA-G, and PXA-R. Thus, the second light emitting element ED-2 overlapping the second pixel area PXA-G may include at least one of the plurality of first emission layers EML1-1 and EML1-2. For example, the second light emitting element ED-2 may include both the first sub-emission layer EML1-1 and the second sub-emission layer EML1-2. Particularly, the second light emitting element ED-2 may have a structure in which the first electrode EL1, the second hole transport region HTR2, the first sub-emission layer EML1-1, the second emission layer EML2, the second sub-emission layer EML1-2, the second electron transport region ETR2, and the second electrode EL2 are sequentially laminated. However, this embodiment is not limited thereto. For example, the first sub-emission layer EML1-1 may be disposed between any two layers of the plurality of layers HIL2, HTL2, and EBL2 included in the second hole transport region HTR2. For example, the second sub-emission layer EML1-2 may be disposed between any two layers of the plurality of layers EIL2, ETL2, and BFL2 included in the second electron transport region ETR2.

In an embodiment, the second emission layer EML2 may be disposed to be spaced apart from the first electrode EL1 by a second optical distance OD2, which is a distance at which the second light resonates at an n-th order. For example, the second emission layer EML2 may be disposed to be spaced apart from the first electrode EL1 by a distance at which the second light secondarily resonates. However, this embodiment is not limited thereto. For example, the second emission layer EML2 may be disposed to be spaced apart from the first electrode EL1 by a distance at which the second light primarily resonates or a distance at which the second light tertiarily resonates.

Referring to FIG. 6B, the second light emitting element ED-2 according to an embodiment may include at least one of the plurality of first emission layers EML1-1, EML1-2 (see FIG. 2A). For example, the second light emitting element ED-2 may not include the first sub-emission layer EML1-1, but may include the second sub-emission layer EML1-2. Particularly, the second light emitting element ED-2 may have a structure in which the first electrode EL1, the second hole transport region HTR2, the second emission layer EML2, the second sub-emission layer EML1-2, the second electron transport region ETR2, and the second electrode EL2 are sequentially laminated.

Figure 7A:
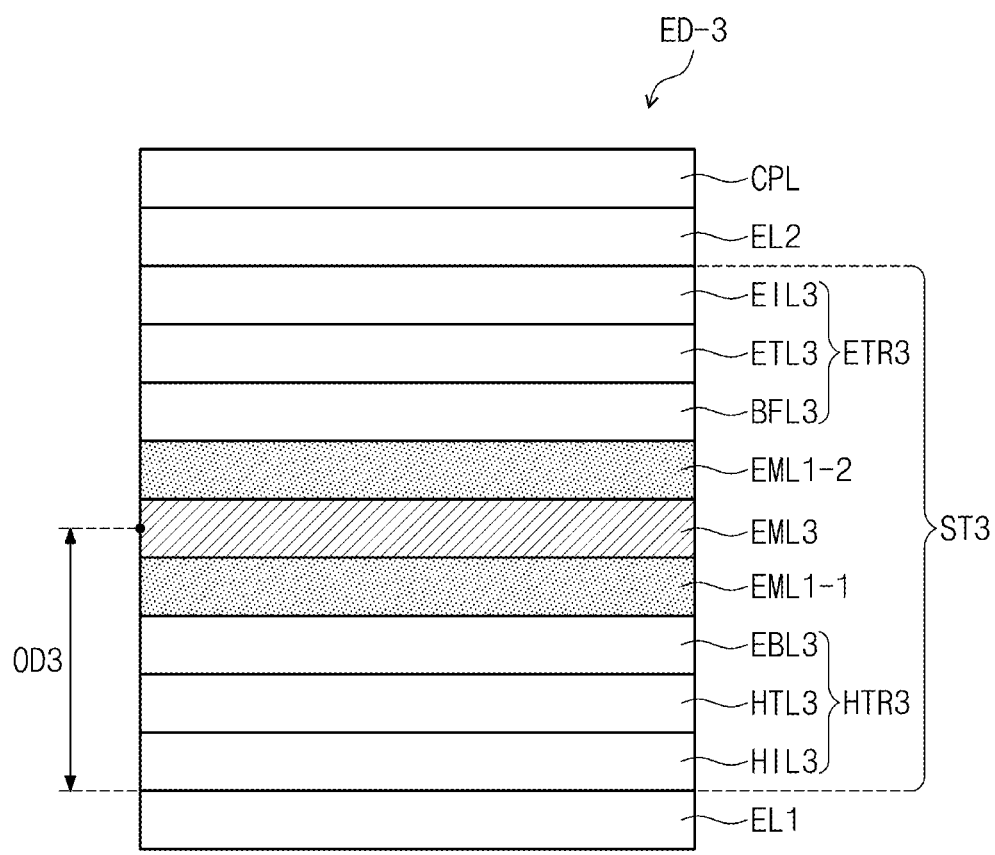
FIGS. 7A and 7B are cross-sectional view of a third light emitting element according to an embodiment.
Figure 7B:
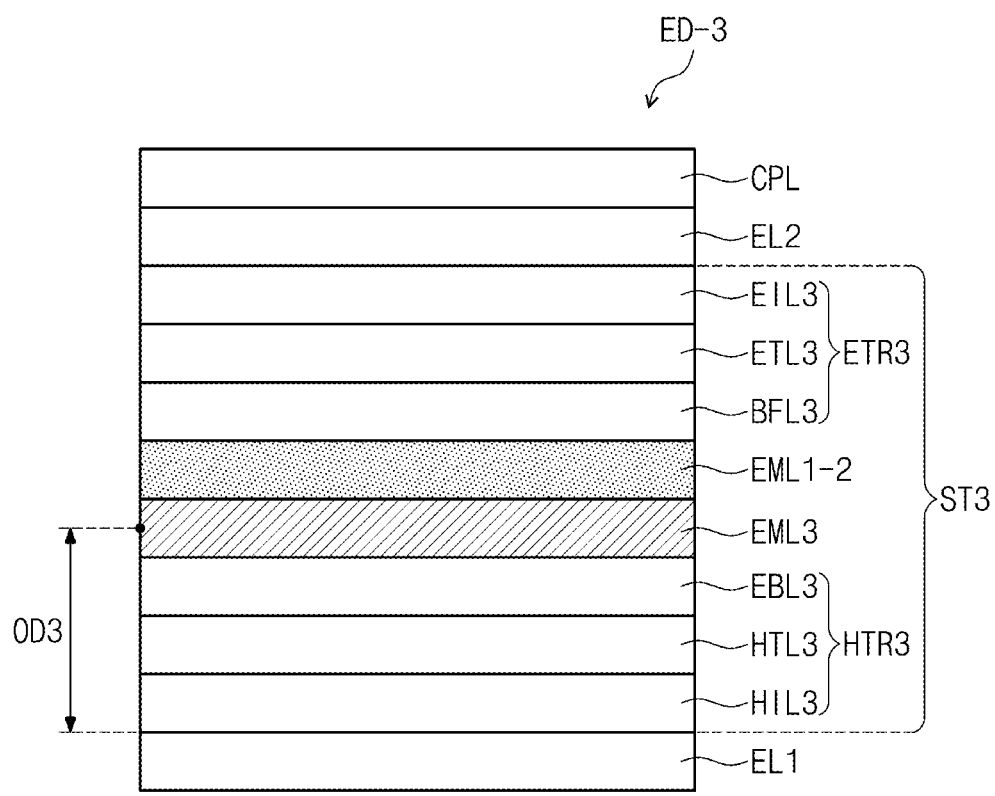

FIGS. 7A and 7B are cross-sectional views of a third light emitting element ED-3 according to an embodiment.

Referring to FIG. 6A, the third light emitting element ED-3 according to an embodiment includes a first electrode EL1, a second electrode EL2 facing the first electrode EL1, and one third light emitting unit structure ST2 disposed between the first electrode EL1 and the second electrode EL2.

The third light emitting unit structure ST3 includes a third emission layer EML3 that emits third light. The third light emitting unit structure ST3 may include a third emission layer EML3 that emits the third light, a third hole transport region HTR3 through which holes provided from the first electrode EL1 are transported to the third emission layer EML3, and a third electron transport region ETR2 through which electrons provided from the second electrode EL2 are transported to the third emission layer EML3.

The third hole transport region HTR3 may include a third hole injection layer HIL3 disposed on the first electrode EL1, a third hole transport layer HTL3 disposed on the third hole injection layer HIL3, and a third hole-side additional layer EBL3 disposed on the third hole transport layer HTL3. The third hole-side additional layer EBL3 may include at least one of a hole buffer layer, an emission auxiliary layer, or an electron blocking layer. The third hole-side additional layer EBL3 may be in contact with the third emission layer EML3. However, this embodiment is not limited thereto. For example, the third hole-side additional layer EBL3 may be omitted, and the third hole transport layer HTL3 may be in contact with the third emission layer EML3.

The third electron transport region ETR3 may include a third electron-side additional layer BFL3 disposed on the third emission layer EML3, a third electron transport layer ETL3 disposed on the third electron-side additional layer BFL3, and a third electron injection layer EIL3 disposed on the third electron transport layer ETL3. The third electron-side additional layer BFL3 may include at least one of an electron buffer layer or a hole blocking layer. The third electron-side additional layer BFL3 may be in contact with the third emission layer EML3. However, this embodiment is not limited thereto. For example, the third electron-side additional layer BFL3 may be omitted, and the third electron transport layer ETL3 may be in contact with the third emission layer EML3.

In an embodiment, at least one of the plurality of first emission layers EML1-1 and EML1-2 included in the first light emitting element ED-1 (see FIG. 2A) overlaps the first to third pixel areas PXA-B, PXA-G, and PXA-R. Thus, the third light emitting element ED-3 overlapping the third pixel area PXA-G may include at least one of the plurality of first emission layers EML1-1 and EML1-2. For example, the third light emitting element ED-3 may include both a first sub-emission layer EML1-1 and a second sub-emission layer EML1-2. Particularly, the third light emitting element ED-3 may have a structure in which the first electrode EL1, the third hole transport region HTR3, the first sub-emission layer EML1-1, the third emission layer EML3, the second sub-emission layer EML1-2, the third electron transport region ETR2, and the second electrode EL2 are sequentially laminated. However, this embodiment is not limited thereto. For example, the first sub-emission layer EML1-1 may be disposed between any two layers of the plurality of layers HIL3, HTL3, and EBL3 included in the third hole transport region HTR3. For example, the second sub-emission layer EML1-2 may be disposed between any two layers of the plurality of layers EIL3, ETL3, and BFL3 included in the third electron transport region ETR3.

In an embodiment, the third emission layer EML3 may be disposed to be spaced apart from the first electrode EL1 by a third optical distance OD3, which is a distance at which the third light resonates at an n-th order. For example, the third emission layer EML3 may be disposed to be spaced apart from the first electrode EL1 by a distance at which the third light secondarily resonates. However, this embodiment is not limited thereto. For example, the third emission layer EML3 may be disposed to be spaced apart from the first electrode EL1 by a distance at which the third light primarily resonates or a distance at which the third light tertiarily resonates.

Referring to FIG. 7B, the third light emitting element ED-3 according to an embodiment may include at least one of the plurality of first emission layers EML1-1, EML1-2 (see FIG. 2A). For example, the third light emitting element ED-3 may not include the first sub-emission layer EML1-1, but may include the second sub-emission layer EML1-2. Particularly, the third light emitting element ED-3 may have a structure in which the first electrode EL1, the third hole transport region HTR3, the third emission layer EML3, the second sub-emission layer EML1-2, the third electron transport region ETR3, and the second electrode EL2 are sequentially laminated.

In the light emitting elements ED-1, ED-2, and ED-3 according to an embodiment, the first electrode EL1 has conductivity. The first electrode EL1 may be made of a metal material, a metal alloy, or a conductive compound. The first electrode EL1 may be an anode or a cathode. However, this embodiment is not limited thereto. Also, the first electrode EL1 may be a pixel electrode.

In the light emitting elements ED-1, ED-2, and ED-3 according to an embodiment, the first electrode EL1 may be a reflective electrode. For example, the first electrode EL1 may include Ag, Mg, Cu, Al, Pt, Pd, Au, Ni, Nd, Ir, Cr, Li, Ca, LiF/Ca, LiF/Al, Mo, Ti, W, or a compound or mixture thereof (for example, a mixture of Ag and Mg) having high reflectivity. Alternatively, the first electrode EL1 may have a multiple layer structure including a transparent conductive film made of indium tin oxide (ITO), indium zinc oxide (IZO), zinc oxide (ZnO), indium tin zinc oxide (ITZO), or the like. For example, the first electrode EL1 may have a two-layer structure of ITO/Ag and a three-layer structure of ITO/Ag/ITO, but is not limited thereto. Also, this embodiment is not limited thereto. For example, the first electrode EL1 may include the above-described metal material, a combination of two or more metal materials selected from the above-described metal materials, or oxide of the above-described metal materials. The first electrode EL1 may have a thickness of about 700 Å to about 10,000 Å. For example, the first electrode EL1 may have a thickness of about 1,000 Å to about 3,000 Å.

In the light emitting elements ED-1, ED-2, and ED-3 according to an embodiment, the hole transport regions HTR1, HTR2, and HTR3 are disposed on the first electrode EL1. In the first light emitting element ED-1 provided with the plurality of emission layers, the first intermediate hole transport region MHTR1 is disposed on the charge generation layer CGL1.

Each of the hole transport regions HTR1, HTR2, HTR3 and the first intermediate hole transport region MHTR1 may have a single layer made of a single material, a single layer made of materials different from each other, or a multi-layered structure including a plurality of layers made of materials different from each other.

Each of the hole transport regions HTR1, HTR2, and HTR3 and the first intermediate hole transport region MHTR1 may be formed by using various methods such as a vacuum deposition method, a spin coating method, a casting method, a langmuir-blodgett (LB) method, an inject printing method, a laser printing method, and a laser induced thermal imaging (LITI) method.

Each of the hole transport regions HTR1, HTR2, and HTR3 and the first intermediate hole transport region MHTR1 may include a phthalocyanine compound such as copper phthalocyanine, N1,N1'-([1,1'-biphenyl]-4,4'-diyl)bis(N1-phenyl-N4,N4-di-m-tolylbenzene-1,4-diamine) (DNTPD), 4,4',4"-[tris(3-methylphenyl)phenylamino] triphenylamine (m-MTDATA), 4,4'4"-Tris(N,N-diphenylamino) triphenylamine (TDATA), 2-TNATA(4,4',4"-tris[N(2-naphthyl)-N-phenylamino]-triphenylamine), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), polyetherketone (TPAPEK) containing triphenylamine, 4-Isopropyl-4'-methyldiphenyliodonium [Tetrakis(pentafluorophenyl)borate], dipyrazino[2,3-f: 2',3'-h]quinoxaline-2,3,6,7,10,11-hexacarbonitrile (HATCN), or the like.

Each of the hole transport regions HTR1, HTR2, and HTR3 and the first intermediate hole transport region MHTR1 may include a carbazole-based derivative such as N-phenylcarbazole and polyvinylcarbazole, a fluorene-based derivative, N,N'-bis(3-methylphenyl)-N,N'-diphenyl-[1,1'-biphenyl]-4,4'-diamine (TPD), a triphenylamine-based derivative such as 4,4',4"-tris(N-carbazolyl)triphenylamine (TCTA), 4,4'-Cyclohexylidene bis[N,N-bis(4-methylphenyl)benzenamine] (TAPC), 4,4'-Bis[N,N'-(3-tolyl)amino]-3,3'-dimethylbiphenyl (HMTPD), 1,3-Bis(N-carbazolyl)benzene (mCP), or the like.

Also, each of the hole transport regions HTR1, HTR2, and HTR3 and the first intermediate hole transport region MHTR1 may include 9-(4-tert-Butylphenyl)-3,6-bis(triphenylsilyl)-9H-carbazole (CzSi), 9-phenyl-9H-3,9'-bicarbazole (CCP), 1,3-Bis(N-carbazolyl)benzene (mCP), or 1,3-bis(1,8-dimethyl-9H-carbazol-9-yl)benzene (mDCP).

The hole transport regions HTR1, HTR2, and HTR3 may include the compounds of the above-described hole transport region in at least one of the hole injection layers HIL1, HIL2, and HIL3, the hole transport layers HTL1, HTL2, and HTL3, and the additional hole-side additional layers EBL1, EBL2, and EBL3. The first intermediate hole transport region MHTR1 may include the compounds of the hole transport region described above in at least one of the first intermediate hole transport layer MHTL1 and the first intermediate hole-side additional layer MEBL1.

Each of the hole transport regions HTR1, HTR2, and HTR3 and the first intermediate hole transport region MHTR1 may have a thickness of about 100 Å to about 10,000 Å, for example, about 100 Å to about 5,000 Å. When the hole transport regions HTR1, HTR2, and HTR3 include the hole injection layers HIL1, HIL2, and HIL3, respectively, each of the hole injection layers HIL1, HIL2, HIL3 may have a thickness of, for example, about 30 Å to about 1,000 Å. When the hole transport regions HTR1, HTR2, and HTR3 include the hole transport layers HTL1, HTL2, and THTL3, respectively, each of the hole transport layers HTL1, HTL2, and HTL3 may have a thickness of about 30 Å to about 1,000 Å. When the hole transport regions HTR1, HTR2, and HTR3 include the hole-side additional layers EBL1, EBL2, and EBL3, respectively, each of the hole-side additional layers EBL1, EBL2, and EBL3 may have a thickness of about 10 Å to about 1,000 Å. The first intermediate hole transport layer MHTL1 included in the first intermediate hole transport region MHTR1 may have a thickness of about 30 Å to about 1,000 Å. The first intermediate hole-side additional layer MEBL1 included in the first intermediate hole transport region MHTR1 may have a thickness of about 10 Å to about 1,000 Å. When each of the hole transport regions HTR1, HTR2, and HTR3, the first intermediate hole transport region MHTR1, and each layer included therein has a thickness that satisfies the above-described range, satisfactory hole transport characteristics may be obtained without a substantial increase in driving voltage.

Each of the hole transport regions HTR1, HTR2, and HTR3 and the first intermediate hole transport region MHTR1 may further include a charge generating material so as to improve conductivity in addition to the above-described material. The charge generation material may be uniformly or non-uniformly dispersed in the hole transport regions HTR1, HTR2, and HTR3 and the first intermediate hole transport region MHTR1. For example, the charge generating material may be a p-dopant. The p-dopant may include at least one of a metal halide compound, a quinone derivative, metal oxide, or a cyano-containing compound, but is not limited thereto. For example, the p-dopant may include a metal halide compound such as CuI and RbI, a quinine derivative such as tetracyanoquinodimethane (TCNQ), and 2,3,5,6-tetrafluoro-tetracyanoquinodimethane (F4-TCNQ), or metal oxide such as tungsten oxide and molybdenum oxide, but is not limited thereto.

The emission layers EML1, EML2, and EML3 are provided on the hole transport regions HTR1, HTR2, and HTR3 or the first intermediate hole transport region MHTR1. The first sub-emission layer EML1-1, the second emission layer EML2, and the third emission layer EML3 are provided on the hole transport regions HTR1, HTR2, and HTR3, and the second sub-emission layer EML1-2 may be provided on the first intermediate hole transport region MHTR1.

The emission layers EML1, EML2, and EML3 may have a thickness of, for example, about 100 Å to about 1,000 Å or about 100 Å to about 300 Å. The emission layer EML may have a single layer structure made of a single material, a single layer structure made of materials different from each other, or a multi-layered structure including a plurality of layers made of materials different from each other.

In the light emitting devices ED-1, ED-2, and ED-3 according to an embodiment, the emission layers EML1, EML2, and EML3 may include an anthracene derivative, a pyrene derivative, a fluoranthene derivative, a chrysene derivative, a dihydrobenzanthracene derivative, or a triphenylene derivative. Particularly, the emission layers EML1, EML2, and EML3 may include an anthracene derivative or a pyrene derivative.

Each of the emission layers EML1, EML2, and EML3 may further include a general material known in the art as a host material. For example, the emission layer EML may include at least one of bis[2-(diphenylphosphino)phenyl] ether oxide (DPEPO), 4,4'-Bis(carbazol-9-yl)biphenyl (CBP), 1,3-Bis(carbazol-9-yl)benzene (mCP), 2,8-Bis(diphenylphosphoryl)dibenzo[b,d]furan (PPF), 4,4',4"-Tris(carbazol-9-yl)-triphenylamine (TCTA), or 1,3,5-tris(1-phenyl-1H-benzo[d]imidazole-2-yl)benzene (TPBi) as the host material. However, this embodiment is not limited thereto. For example, tris(8-hydroxyquinolino)aluminum (Alq3), poly(N-vinylcarbazole) (PVK), 9,10-di(naphthalene-2-yl) anthracene (ADN), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-Methyl-9,10-bis (naphthalen-2-yl)anthracene (MADN), hexaphenyl cyclotriphosphazene (CP1), 1,4-Bis(triphenylsilyl)benzene (UGH2), hexaphenyl cyclotrisiloxane (DPSiO3), octaphenylcyclotetra siloxane (DPSiO4), or the like may be used as the host material.

In an embodiment, the emission layers EML1, EML2, and EML3 may include styryl derivatives (for example, 1,4-bis [2-(3-N-ethylcarbazoryl)vinyl]benzene (BCzVB), 4-(di-p-tolylamino)-4'-[(di-p-tolylamino)styryl]stilbene (DPAVB), N-(4-((E)-2-(6-((E)-4-(diphenylamino)styryl)naphthalen-2-yl)vinyl)phenyl)-N-phenylbenzenamine (N-BDAVBi), 4,4'-bis[2-(4-(N,N-diphenylamino)phenyl)vinyl]biphenyl (DPAVBi)), perylene and its derivatives (for example, 2,5, 8,11-Tetra-t-butylperylene (TBP)), pyrene, or their derivatives (for example, 1,1-dipyrene, 1,4-dipyrenylbenzene, 1,4-Bis(N,N-Diphenylamino) pyrene) as the known dopant materials.

The emission layers EML1, EML2, and EML3 may include a known phosphorescent dopant material. For example, a metal complex containing iridium (Ir), platinum (Pt), osmium (Os), gold (Au), titanium (Ti), zirconium (Zr), hafnium (Hf), europium (Eu), and terbium (Tb) or thulium (Tm) may be used as the phosphorescent dopant. Particularly, bis(4,6-difluorophenylpyridinato-N,C2_), Fir6(Bis(2, 4-difluorophenylpyridinato)-tetrakis(1-pyrazolyl)borate iridium(III) (Flrpic(iridium(III)) or platinum octaethyl porphyrin (PtOEP) may be used as the phosphorescent dopant. However, the embodiment is not limited thereto.

The first emission layer EML1 generates first light. The second emission layer EML2 generates second light. The third emission layer EML2 generates third light. In the light emitting elements ED-1, ED-2, and ED-3 according to an embodiment, the first light to the third light may be light having substantially different wavelength ranges. For example, the first light may be blue light having a wavelength range of about 410 nm to about 480 nm. For example, the second light may be green light having a wavelength range of about 500 nm to about 570 nm. For example, the third light may be red light having a wavelength range of about 625 nm to about 675 nm.

The electron transport regions ETR1, ETR2, and ETR3 and the first intermediate electron transport region MTR1 is disposed on the emission layers EML1, EML2, and EML3, respectively. In the first light emitting element ED-1 provided with the plurality of emission layers, the first intermediate electron transport region MTR1 may be disposed between the first sub-emission layer EML1-1 and the charge generation layer CGL1, and the first electron transport region ETR1 may be disposed between the second sub-emission layer EML1-2 and the second electrode EL2. Each of the electron transport regions ETR1, ETR2, ETR3 and the first intermediate electron transport region METR1 may have a single layer made of a single material, a single layer made of materials different from each other, or a multi-layered structure including a plurality of layers made of materials different from each other.

Each of the electron transport regions ETR1, ETR2, and ETR3 and the first intermediate electron transport region METR1 may be formed by using various methods such as a vacuum deposition method, a spin coating method, a casting method, a langmuir-blodgett (LB) method, an inject printing method, a laser printing method, and a laser induced thermal imaging (LITI) method.

Each of the electron transport regions ETR1, ETR2, and ETR3 and the first intermediate electron transport region METR1 may include an anthracene-based compound. However, this embodiment is not limited thereto. For example, each of the electron transport regions ETR1, ETR2, and ETR3 may include, for example, tris(8-hydroxyquinolinato) aluminum (Alq3), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl)phenyl)-9,10-dinaphthylanthracene, 1,3,5-Tri(1-phenyl-1H-benzo[d]imidazol-2-yl)benzene (TPBi), 2,9-Dimethyl-4,7-diphenyl-1,10-phenanthroline (BCP), 4,7-Diphenyl-1,10-phenanthroline (Bphen), 3-(4-Biphenylyl)-4-phenyl-5-tert-butylphenyl-1,2,4-triazole (TAZ), 4-(Naphthalen-1-yl)-3,5-diphenyl-4H-1,2,4-triazole (NTAZ), 2-(4-Biphenylyl)-5-(4-tert-butylphenyl)-1,3,4-oxadiazole (tBu-PBD), Bis(2-methyl-8-quinolinolato-N1,O8)-(1,1'-Biphenyl-4-olato)aluminum (BAlq), berylliumbis(benzoquinolin-10-olate) (Bebq2), 9,10-di(naphthalene-2-yl)anthracene (ADN), 1,3-Bis[3,5-di(pyridin-3-yl)phenyl]benzene (BmPyPhB), or a mixture thereof.

Also, each of the electron transport regions ETR1, ETR2, and ETR3 and the first intermediate electron transport region METR1 may include a metal halide such as LiF, NaCl, CsF, RbCl, RbI, CuI, and KI, a lanthanum group metal such as Yb, or a co-deposited material of the above metal halide and the lanthanum group metal. For example, the electron transport regions ETR1, ETR2, and ETR3 may include KI:Yb, RbI:Yb, or the like as the co-deposition material. As the electron transport regions ETR1, ETR2, and ETR3, metal oxide such as Li2O and BaO, or 8-hydroxyl-Lithium quinolate (Liq), or the like may be used, but this embodiment is not limited thereto. Also, each of the electron transport regions ETR1, ETR2, and ETR3 may be made of a mixture of the electron transport material and organo metal salt having insulation. The organo metal salt may be a material having an energy band gap of about 4 eV or more. For example, the organo metal salt may include metal acetate, metal benzoate, metal acetoacetate, metal acetylacetonate, or metal stearate.

Each of the electron transport regions ETR1, ETR2, and ETR3 and the first intermediate electron transport region METR1 may further include at least one of 2,9-dimethyl-4,7-diphenyl-1,10-phenanthroline (BCP) or 4,7-diphenyl-1,10-phenanthroline (Bphen) in addition to the above-described materials, but this embodiment is not limited thereto.

In the electron transport regions ETR1, ETR2, and ETR3, the above-described compounds of the electron transport regions may be provided in at least one of the electron injection layers EIL1, EIL2, and EIL3, the electron transport layers ETL1, ETL2, and ETL3, or the electron-side additional layers BFL1, BFL2, and BFL3. In the first intermediate electron transport region MTR1, the above-described compounds of the electron transport region may be provided in at least one of the first intermediate electron transport layer MTL1 or the first intermediate electron-side additional layer MBFL1.

Each of the electron transport regions ETR1, ETR2, and ETR3 and the first intermediate electron transport region MTR1 may have a thickness of, for example, about 1,000 Å to about 1,500 Å. When the electron transport regions ETR1, ETR2, and ETR3 include the electron transport layers ETL1, ETL2, and ETL3, respectively, each of the electron transport layers ETL1, ETL2, and ETL3 may have a thickness about 100 Å to about 1,000 Å, for example, about 150 Å to about 500 Å. When each of the electron injection layers ETL1, ETL2, and ETL3 has a thickness within the above-described range, satisfactory electron injection characteristics may be achieved without substantially increasing in driving voltage. When the electron transport regions ETR1, ETR2, and ETR3 include the electron injection layers EIL1, EIL2, and EIL3, respectively, each of the electron injection layers EIL1, EIL2, and EIL3 may have a thickness of about 1 Å to about 100 Å, for example, about 3 Å to about 90 Å. When each of the electron injection layers EIL1, EIL2, and EIL3 has a thickness within the above-described range, satisfactory electron injection characteristics may be achieved without substantially increasing in driving voltage. The first intermediate electron transport layer MTL1 included in the first intermediate electron transport region MTR1 may have a thickness of about 100 Å to about 1000 Å, for example, about 150 Å to about 500 Å.

The second electrode EL2 may be disposed on the electron transport regions ETR1, ETR2, and ETR3. The second electrode EL2 may be a common electrode The second electrode EL2 may be a cathode or an anode, but this embodiment is not limited thereto. For example, when the first electrode EL1 is the anode, the second electrode EL2 may be the cathode, and when the first electrode EL1 is the cathode, the second electrode EL2 may be the anode.

The second electrode EL2 may be a transflective electrode, or a reflective electrode. When the second electrode EL2 is the transmissive electrode, the second electrode EL2 may be made of metal oxide, for example, indium tin oxide (ITO), indium zinc oxide (IZO), zinc oxide (ZnO), or indium tin zinc oxide (ITZO).

When the second electrode EL2 is the transflective electrode, the second electrode EL2 may include g, Mg, Cu, Al, Pt, Pd, Au, Ni, Nd, Ir, Cr, Li, Ca, LiF/Ca, LiF/Al, Mo, Ti, Yb, W, or a compound or mixture (for example, AgMg, AgYb, or MgAg) thereof. Alternatively, the second electrode ED2 may have a multiple layer structure including the reflective layer or transflective layer, which is made of the above-described material, indium tin oxide (ITO), indium zinc oxide (IZO), zinc oxide (ZnO), or indium tin zinc oxide (ITZO). For example, the second electrode EL2 may include the above-described metal material, a combination of two or more metal materials selected from the above-described metal materials, or oxide of the above-described metal materials.

The second electrode EL may be connected to an auxiliary electrode. When the second electrode EL2 is connected to the auxiliary electrode, the second electrode EL2 may be reduced in resistance.

A capping layer CPL may be further disposed on the second electrode EL2 of the light emitting elements ED-1, ED-2, and ED-3 according to an embodiment. The capping layer CPL may include multiple layers or a single layer.

In an embodiment, the capping layer CPL may be an organic layer or an inorganic layer. For example, when the capping layer CPL may include the inorganic material, the inorganic material may include an alkali metal compound such as LiF, an alkaline earth metal compound such as $MgF_2$, SiON, $SiN_X$, $SiO_Y$, or the like.

For example, when the capping layer CPL includes the organic material, the organic material may include α-NPD, NPB, TPD, m-MTDATA, Alq3, CuPc, N4,N4,N4',N4'-tetra(biphenyl-4-yl) biphenyl-4,4'-diamine (TPD15), 4,4',4"-Tris(carbazol sol-9-yl) triphenylamine (TCTA), or the like, and may include an epoxy resin, or acrylic such as methacrylate. However, this embodiment is not limited thereto. For example, the capping layer CPL may include at least one of the following compounds P1 to P5.

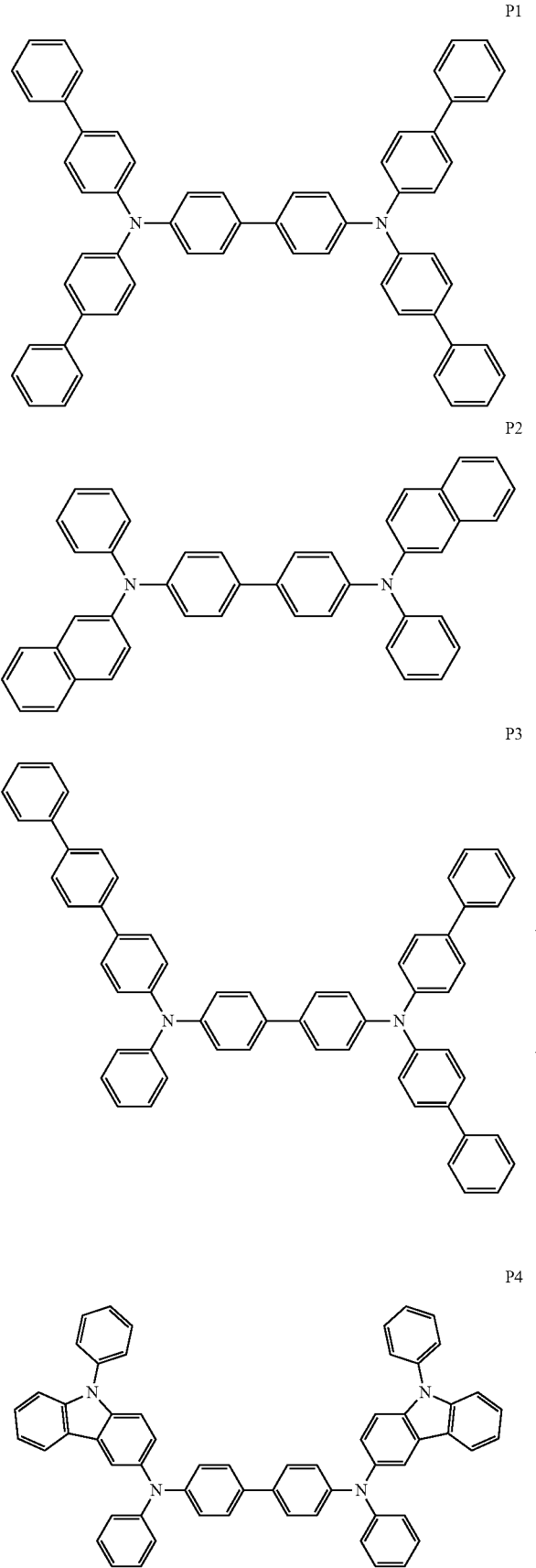

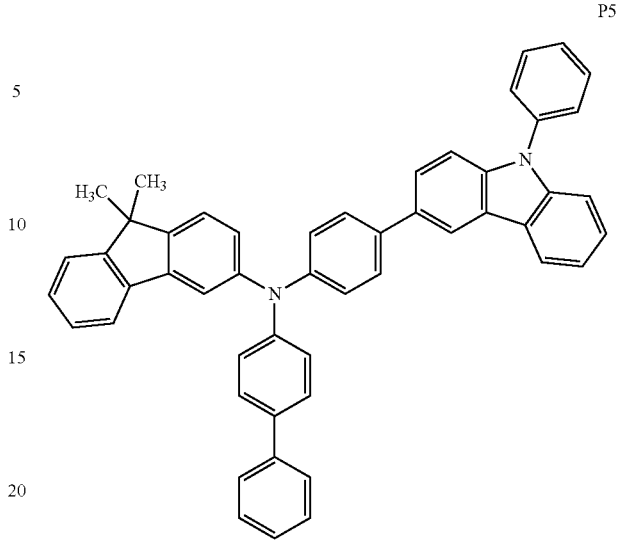

The capping layer CPL may have a refractive index of about 1.6 or more. Particularly, the capping layer CPL may have a refractive index of about 1.6 or more for light having a wavelength range of about 550 nm or more and about 660 nm or less.

Embodiment

Hereinafter, characteristic evaluation results for color purity and luminous efficiency of the display device according to the inventive concept will be described with reference to specific embodiments. Embodiments described herein are not limited to the following examples.

(Evaluation of Characteristics of Second Light Emitting Element and Third Light Emitting Element)

In Tables 1 and 2 below, color purity and luminous efficiency of second light and third light, which are emitted from the second and third light emitting elements according to various embodiments were evaluated. In an embodiment, the second light emitting element may emit green light, and the third light emitting element may emit red light.

In Table 1, "Ref 1" is green light emitted from the second light emitting element, which does not include a first emission layer. In Embodiment A, green light emitted from the second light emitting element, which includes the first sub-emission layer, but does not include the second sub-emission layer according to the inventive concept, is emitted. The above description may be applied equally to the first sub-emission layer and the second sub-emission layer. Particularly, at least one of the first sub-emission layer and the second sub-emission layer may be included in all of the first to third light emitting elements.

In Embodiment B, green light emitted from the second light emitting element, which includes both the first sub-emission layer and the second sub-emission layer according to the inventive concept, is emitted.

An X-coordinate and a Y-coordinate shown in Table 1 are CIE color coordinate values.

TABLE 1

| Classification | X-coordinate | Y-coordinate | Light emitting efficiency (cd/A) |
|---|---|---|---|
| Ref 1 | 0.226 | 0.724 | 136.1 |
| Embodiment A | 0.238 | 0.722 | 137.9 |
| Embodiment B | 0.218 | 0.729 | 135.3 |

Referring to Table 1, X-coordinate values of Embodiments A and B are similar to X-coordinate values of Ref 1. Also, Y-coordinate values of Embodiments A and Embodiment B are similar to Y-coordinate value of Ref 1.

When comparing the luminous efficiency, luminous efficiency of each of Embodiments A and B has a value similar to that of Ref 1. Particularly, Embodiment A has a value higher than the luminous efficiency of Ref 1, and Embodiment B has a value lower than that of Ref 1, but has a value similar to that of Ref 1 and has a good level of the luminous efficiency characteristics.

In Table 2, "Ref 2" is red light emitted from the third light emitting element, which does not include the first emission layer.

In Embodiment C, red light emitted from the third light emitting element, which includes the first sub-emission layer, but does not include the second sub-emission layer according to the inventive concept, is emitted.

In Embodiment D, red light emitted from the third light emitting element, which includes both the first sub-emission layer and the second sub-emission layer according to the inventive concept, is emitted.

An X-coordinate and a Y-coordinate shown in Table 2 are CIE color coordinate values.

TABLE 2

| Classification | X-coordinate | Y-coordinate | Light emitting efficiency |
|---|---|---|---|
| Ref 2 | 0.688 | 0.312 | 39.1 |
| Embodiment C | 0.686 | 0.314 | 37.1 |
| Embodiment D | 0.687 | 0.313 | 38.0 |

Referring to Table 2, X-coordinate values of Embodiments C and D are similar to X-coordinate values of Ref 2. Also, Y-coordinate values of Embodiments C and Embodiment D are similar to Y-coordinate value of Ref 2. When comparing the luminous efficiency, luminous efficiency of each of Embodiments C and D has a value similar to that of Ref 2, but has a value similar to that of Ref 2 and has a good level of the luminous efficiency characteristics.

Figure 8A:
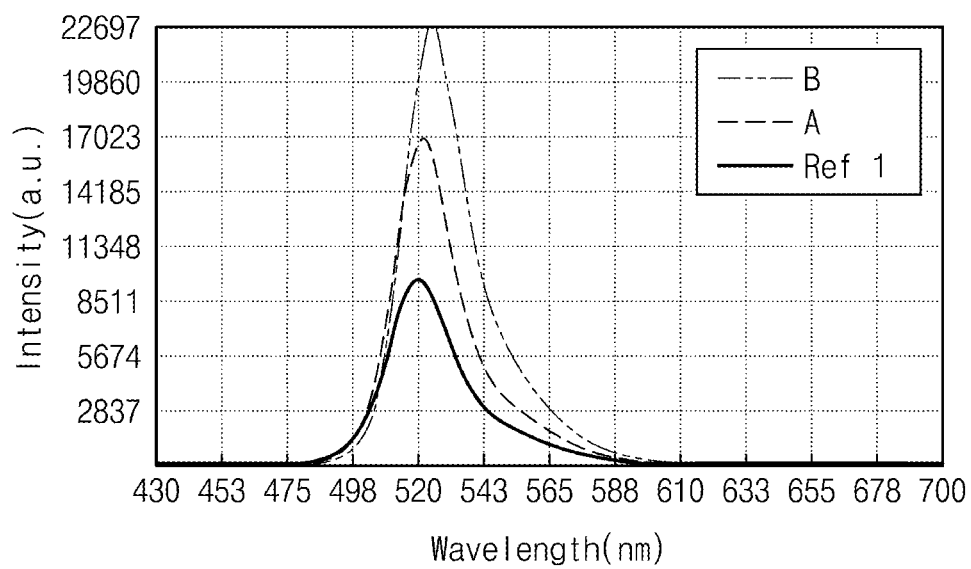
FIG. 8A is a graph illustrating wavelength spectra according to Ref 1, Embodiment A, and Embodiment B.
Figure 8B:
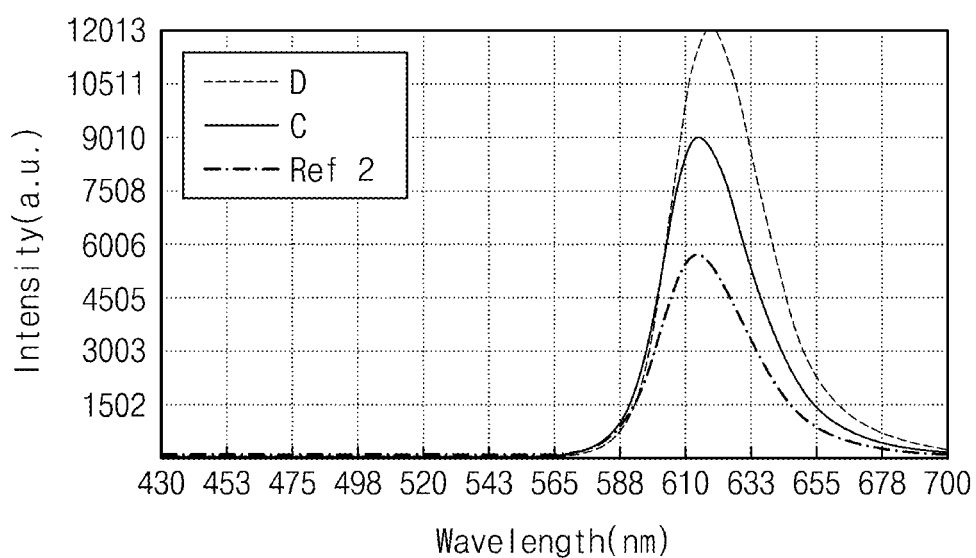
FIG. 8B is a graph illustrating wavelength spectra according to Ref 2, Embodiment C, and Embodiment D.

FIGS. 8A and 8B may be referred to together with Embodiments.

FIG. 8A are graphs illustrating wavelength spectra according to Ref 1, Embodiment A, and Embodiment B. FIG. 8B are graphs illustrating wavelength spectra according to Ref 2, Embodiment C, and Embodiment D.

In the graphs of FIGS. 8A and 8B, a wavelength is denoted by an x-axis, and an intensity is denoted by a y-axis.

Referring to FIG. 8A, a center wavelength of Ref1 is about 520 nm. The center wavelength of each of Embodiments A and B has a value of about 520 nm or more and about 543 nm or less. That is, it is be seen that each of Embodiment A and Embodiment B has a center wavelength value similar to that of Ref1 and represents a wavelength of the green light.

Referring to FIG. 8B, a center wavelength of Ref 2 is about 628 nm. The center wavelength of each of Embodiments has a value of about 610 nm or more and about 633 nm or less. That is, it is seen that each of Embodiment C and Embodiment D has a center wavelength value similar to that of Ref2 and represents a wavelength of the red light.

Referring to Tables 1 and 2, and FIGS. 8A and 8B together, in the display device according to an embodiment, it is seen that even if at least one of the plurality of first emission layers included in the first light emitting element overlaps the second light emitting element and the third light emitting element, color mixing between the second light emitted from the second light emitting element and the third light emitted from the third pixel area does not occur.

As a result, in the display device according to an embodiment, it is seen that although at least one of the first sub-emission layer and the second sub-emission layer is commonly disposed on the first light emitting element, the second light emitting element, and the third light emitting element, the display device according to an embodiment has excellent color purity and good luminous efficiency.

The display device according to an embodiment includes the plurality of light emitting devices that emit light having different wavelengths. Here, one of the plurality of light emitting devices includes the plurality of emission layers, and the other includes one emission layer. For example, the first light emitting element ED-1 that emits the blue light may be the tandem structure which includes the plurality of first emission layers EML1 and in which the charge generation layer CGL1 is disposed between the plurality of first emission layers EML1. The light emitting elements other than the first light emitting element ED-1, that is, each of the second light emitting element ED-2 and the third light emitting element ED-3 may be the light emitting element including one emission layer EML2 or EML3.

The light emitting element having the tandem structure may have superior efficiency compared to the general light emitting device including one emission layer, but require a plurality of mask patterning processes for patterning the organic layer in the process of manufacturing the light emitting device and has a high defect rate in the manufacturing process.

In the display device according to an embodiment, since at least one of the plurality of first emission layers included in the first light emitting element overlaps the first to third pixel areas, at least one of the plurality of first emission layers may be commonly formed in the second light emitting element and the third light emitting element. Therefore, the number of masks required for manufacturing the display device and the mask patterning process may be reduced. In the display device according to one or more embodiments, the manufacturing process efficiency and the defect rate may be reduced.

Figure 9:
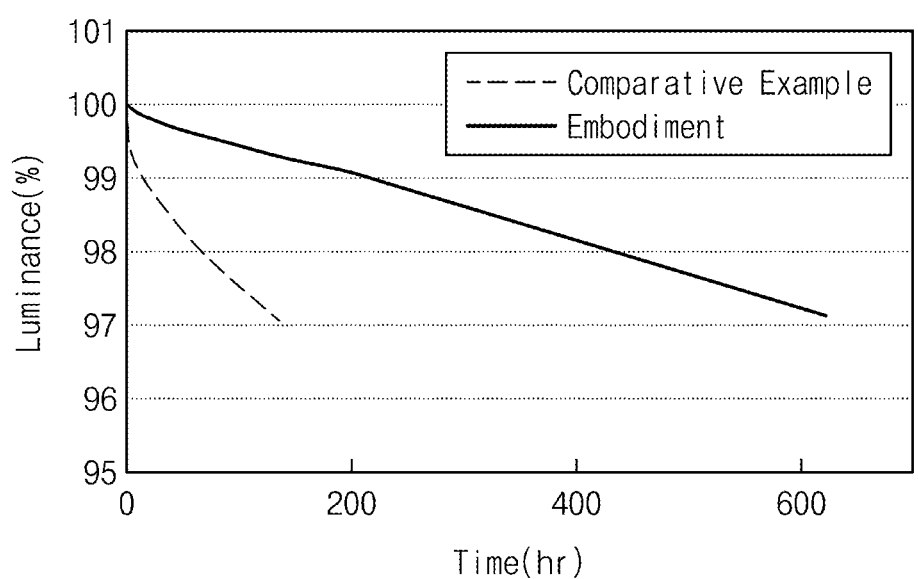
FIG. 9 is a graph illustrating results obtained by comparing time-varying luminance according to the first light emitting element according to an embodiment and a Comparative Example.

FIG. 9 is a graph illustrating results obtained by comparing time-varying luminance according to the first light emitting element according to an embodiment and a Comparative Example.

In FIG. 9, "Embodiment" shows a luminance lifespan of the first light emitting element including the plurality of first emission layers and emitting the blue light as illustrated in FIG. 2A. Unlike that illustrated in FIG. 2A, "Comparative Example" shows a graph in which the luminance lifespan of the first light emitting element that does not include the plurality of first emission layers, but includes one emission layer and emits the blue light.

In Embodiment FIG. 9 and Comparative Example FIG. 2A, comparing a deterioration time of the first light emitting element from 100% initial luminance to 97% luminance, about 600 hours or more are taken in Embodiment, and about 200 hours are not taken in Comparative Example. That is, it is seen that the luminance lifespan is improved by about 2.5 times or more when compared to Comparative Example.

Therefore, in the display device according to one or more embodiments, since the first light emitting element ED-1 has the tandem structure which including the plurality of first emission layers EML1-1 and EML1-2 and in which the charge generation layer CGL1 is disposed between the plurality of first emission layers EML1-1 and EML1-2, the luminance lifespan of the first light emitting element ED-1 may be improved, and the good color purity and luminous efficiency of the second and third light emitting elements may be maintained.

In addition, in the light emitting device according to one or more embodiments, since at least one of the plurality of first emission layers EML1-1 and EML1-2 is commonly used in the first to third pixel areas PXA-B, PXA-G, and PXA-R, the number of masks required in the process of forming the light emitting element may be reduced, and thus, the cost, time, and defect rate in the manufacturing process of the display device may be reduced.

In the display device according to one or more embodiments, the plurality of light emitting structure stacks may be provided in some light emitting elements of the plurality of light emitting elements, and one light emitting structure stack may be provided in the remaining light emitting elements to improve the luminance lifespan of the display device and reduce the defect rate during the manufacturing.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
    a substrate having a first pixel area configured to emit first light, a second pixel area configured to emit second light having an emission wavelength different from that of the first light, and a third pixel area configured to emit third light having an emission wavelength different from that of each of the first light and the second light;
    a first electrode disposed on the substrate to overlap the first pixel area and the second pixel area;
    a first organic layer disposed on the first electrode to overlap the first pixel area;
    a second organic layer disposed on the first electrode to overlap the second pixel area;
    a third organic layer disposed on the first electrode to overlap the third pixel area; and
    a second electrode disposed on the first organic layer and the second organic layer to overlap the first pixel area and the second pixel area,
    wherein the first organic layer comprises a first hole transport region, a plurality of first emission layers configured to emit the first light, a charge generation layer disposed between the plurality of first emission layers, and a first electron transport region, which are disposed on the first electrode,
    the second organic layer comprises a second hole transport region, a second emission layer configured to emit the second light, and a second electron transport region, which are sequentially disposed on the first electrode,
    the plurality of first emission layers comprises:
        a first sub-emission layer disposed between the first hole transport region and the charge generation layer in the first pixel area and between the second hole transport region and the second emission layer without a charge generation layer therebetween in the second pixel area; and
        a second sub-emission layer disposed between the charge generation layer and the first electron transport region in the first pixel area and between the second emission layer and the second electron transport region without a charge generation layer therebetween in the second pixel area, and
    each of the first sub-emission layer and the second sub-emission layer continuously extend between and overlap all of the first pixel area to the third pixel area.

2. The display device of claim 1, wherein the first light is blue light, and the second light is green light or red light.

3. The display device of claim 1, wherein the third organic layer comprises a third hole transport region, a third emission layer configured to emit the third light, and a third electron transport region, which are sequentially disposed on the first electrode.

4. The display device of claim 1, wherein the third organic layer comprises a third emission layer configured to emit the third light, and
    the third emission layer is disposed between the first sub-emission layer and the second sub-emission layer.

5. The display device of claim 1, wherein the charge generation layer comprises:
    an n-type charge generation layer disposed adjacent to the first sub-emission layer; and
    a p-type charge generation layer disposed adjacent to the second sub-emission layer.

6. The display device of claim 1, wherein the first hole transport region comprises a hole transport layer disposed under the plurality of first emission layers.

7. The display device of claim 1, wherein the first organic layer further comprises a first intermediate electron transport layer disposed under the second sub-emission layer.

8. The display device of claim 1, further comprising a capping layer disposed on the second electrode,
    wherein the capping layer has a reflective index of about 1.6 or more.

9. A display device comprising:
    a substrate having a first pixel area configured to emit first light, a second pixel area configured to emit second light different from the first light, and a third pixel area configured to emit third light different from each of the first light and the second light;
    a first light emitting element configured to overlap the first pixel area;
    a second light emitting element configured to overlap the second pixel area; and
    a third light emitting element configured to overlap the third pixel area,
    wherein the first light emitting element comprises a first sub-emission layer and a second sub-emission layer configured to emit the first light,
    the second light emitting element comprises one second emission layer configured to emit the second light,
    the third light emitting element comprises one third emission layer configured to emit the third light, and
    each of the first sub-emission layer and the second sub-emission layer overlaps the first pixel area, the second pixel area, and the third pixel area, and the one second emission layer is between the first sub-emission layer and the second sub-emission layer without a charge generation layer therebetween in the second pixel area, and the one third emission layer is between the first sub-emission layer and the second sub-emission layer without a charge generation layer therebetween in the third pixel area.

10. The display device of claim 9, wherein the first light is blue light, and one of the second light and the third light is red light, and the other is green light.

11. The display device of claim 9, wherein the first light emitting element further comprises:

a first electrode and a first hole transport region, which are disposed under the first sub-emission layer and the second sub-emission layer; and a first electron transport region and a second electrode, which are disposed above the first sub-emission layer and the second sub-emission layer.

12. The display device of claim 11, wherein the first light emitting element further comprises a charge generation layer disposed between the first sub-emission layer and the second sub-emission layer.

13. The display device of claim 11, wherein the second light emitting element further comprises:

a second hole transport region disposed under the second emission layer; and a second electron transport region disposed on the second emission layer.

14. The display device of claim 13, wherein the second light emitting element further comprises an additional hole transport layer disposed between the second emission layer and the second hole transport region.

* * * * *